US012740145B2

(12) United States Patent
Kim

(10) Patent No.: US 12,740,145 B2
(45) Date of Patent: Sep. 15, 2026

(54) DISPLAY DEVICE AND METHOD OF MANUFACTURING THE SAME

(71) Applicant: Samsung Display Co., LTD., Yongin-si (KR)

(72) Inventor: Ki Bum Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 612 days.

(21) Appl. No.: 18/102,165

(22) Filed: Jan. 27, 2023

(65) Prior Publication Data

US 2023/0411406 A1 Dec. 21, 2023

(30) Foreign Application Priority Data

Jun. 15, 2022 (KR) ........................ 10-2022-0073066

(51) Int. Cl.

*H10D 86/60* (2025.01)
*G09G 3/32* (2016.01)
*H10D 86/01* (2025.01)
*H10D 86/40* (2025.01)
*H10W 90/00* (2026.01)

(52) U.S. Cl.

CPC ............... *H10D 86/60* (2025.01); *G09G 3/32* (2013.01); *H10D 86/021* (2025.01); *H10D 86/443* (2025.01); *H10W 90/00* (2026.01); *G09G 2300/0819* (2013.01); *G09G 2300/0842* (2013.01)

(58) Field of Classification Search

CPC ............... H01L 23/60; H01L 22/10–14; H01L 22/20–26; H01L 21/311–31144; H01L 21/3213–32139; H10D 86/443; H10D 89/811; H10D 89/911; H10D 89/60–931; H05K 1/0259; H05K 9/0067; H01R 13/6485; G01R 31/26–275; G01R 31/28–2898; G01R 31/303; H10H 20/00–882; H10H 29/00–142; H10H 29/30–962; G09G 2330/04–12

See application file for complete search history.

(56) References Cited

U.S. PATENT DOCUMENTS

| | | | | |
|---|---|---|---|---|
| 2014/0210807 A1* | 7/2014 | Kim | ..................... | H10D 89/931 345/212 |
| 2020/0343326 A1* | 10/2020 | Park | ..................... | G09G 3/3233 |

FOREIGN PATENT DOCUMENTS

KR 10-2017-0109118 A 9/2017

OTHER PUBLICATIONS

Korean Notice of Allowance dated Jul. 9, 2026, issued in Korean Patent Application No. 10-2022-0073066 (6 pages).

* cited by examiner

*Primary Examiner* — Matthew C Landau
*Assistant Examiner* — Nora T. Nix
(74) *Attorney, Agent, or Firm* — Womble Bond Dickinson (US) LLP

(57) ABSTRACT

A display device includes a pixel. The pixel is disposed in a display area of a substrate, and is electrically connected to a first power line and a data line. An electrostatic discharge prevention circuit is disposed in a non-display area of the substrate, and is electrically connected between the data line and the first power line. The electrostatic discharge prevention circuit is electrically connected directly to the first power line, and is selectively electrically connected to the data line through a bridge line. The bridge line and the first power line are disposed in different layers with at least one insulating layer interposed therebetween.

17 Claims, 20 Drawing Sheets

DISPLAY DEVICE AND METHOD OF MANUFACTURING THE SAME

CROSS-REFERENCE TO RELATED APPLICATION(S)

This application claims priority to and benefits of Korean patent application No. 10-2022-0073066 under 35 U.S.C. § 119(a), filed on Jun. 15, 2022 in the Korean Intellectual Property Office, the entire contents of which are incorporated herein by reference.

BACKGROUND

1. Technical Field

The disclosure relates to a display device and a method of manufacturing the same.

2. Description of the Related Art

As interest in information displays and demand for portable information media increase, research and commercialization has focused on display devices.

SUMMARY

Embodiments provide a display device having improved reliability and a method of manufacturing the display device.

In accordance with an aspect of the disclosure, there is provided a display device that may include a pixel disposed in a display area of a substrate, the pixel being electrically connected to a first power line and a data line, and an electrostatic discharge prevention circuit disposed in a non-display area of the substrate, the electrostatic discharge prevention circuit being electrically connected between the data line and the first power line. The electrostatic discharge prevention circuit may be electrically connected directly to the first power line, and may be selectively electrically connected to the data line through a bridge line. The bridge line and the first power line may be disposed in different layers with at least one insulating layer interposed therebetween.

The electrostatic discharge prevention circuit may include a transistor and a first bridge pattern disposed on a gate electrode of the transistor to form a first capacitor together with the gate electrode. The bridge line may be disposed on the first bridge pattern and be in electrical contact with the first bridge pattern through a via hole.

The bridge line may be in electrical contact with a second bridge pattern disposed in a same layer as the first bridge pattern through a via hole. The second bridge pattern may be in electrical contact with the data line through a contact hole.

The first power line and the first bridge pattern may be disposed in a same layer. The first power line may form a second capacitor together with the gate electrode of the transistor.

The pixel may include a first electrode and a second electrode that are spaced apart from each other, and a light emitting element disposed between the first electrode and the second electrode. The first electrode, the second electrode, and the bridge line may be disposed in a same layer.

The bridge line, the first electrode, and the second electrode may include a same material. The bridge line, the first electrode, and the second electrode may be formed through a same process.

The bridge line, the first electrode, and the second electrode may include an opaque metal. The first electrode and the second electrode may reflect light emitted from the light emitting element in an image display direction.

A portion of the bridge line may be removed, so that the electrostatic discharge prevention circuit may become electrically separated from the data line.

The display device may further include a first insulating layer covering the bridge line, the first electrode, and the second electrode. A portion of the first insulating layer, which corresponds to the portion of the bridge line, may be removed.

The bridge line may be disposed while traversing another data line disposed between the electrostatic discharge prevention circuit and the data line.

In accordance with another aspect of the disclosure, there is provided a display device that may include data lines disposed in a first direction, the data lines extending in a second direction, a first power line extending in the second direction, pixels electrically connected to the first power line and the data lines, and electrostatic discharge prevention circuits disposed between the first power line and the data lines, the electrostatic discharge prevention circuits each being electrically connected to the first power line and a corresponding data line among the data lines. One of the electrostatic discharge prevention circuits may be selectively electrically connected to one of the data lines through a first bridge line. Another of the electrostatic discharge prevention circuits may be selectively electrically connected to another of the data lines through a second bridge line. The first bridge line and the first power line may be disposed in different layers.

The electrostatic discharge prevention circuits may be disposed in the second direction between the one of the data lines and the first power line.

The second bridge line may extend in the second direction and traverse the one of the data lines.

At least one of the first bridge line and the second bridge line may be partially removed, so that at least one of the electrostatic discharge prevention circuits may become electrically separated from the corresponding data line.

Each of the pixels may include a first electrode and a second electrode that may be spaced apart from each other, and a light emitting element disposed between the first electrode and the second electrode. The first electrode, the second electrode, and the bridge line may be disposed in a same layer.

The bridge line, the first electrode, and the second electrode may include a same material. The bridge line, the first electrode, and the second electrode may be formed through a same process.

In accordance with still another aspect of the disclosure, there is provided a method of manufacturing a display device. The method may include preparing a panel including a first power line, a data line, a pixel circuit, and an electrostatic discharge prevention circuit, each of the pixel circuit and the electrostatic discharge prevention circuit being electrically connected to the first power line and the data line and including at least one transistor, forming a first electrode, a second electrode, and a bridge line on the panel, the bridge line being selectively electrically connected to the electrostatic discharge prevention circuit and the data line, aligning a light emitting element between the first electrode and the second electrode, and removing a portion of the bridge line.

The portion of the bridge line may be removed, so that the electrostatic discharge prevention circuit may become electrically separated from the data line.

The removing of the portion of the bridge line may include simultaneously removing a portion of at least one of the first electrode and the second electrode with the portion of the bridge line.

The method may further include before the removing of the portion of the bridge line, electrically connecting a driver to the data line, and inspecting a connection state between the driver and the data line. The portion of the bridge line may be removed based on a result of the inspection.

DETAILED DESCRIPTION OF THE EMBODIMENTS

Figure 1:
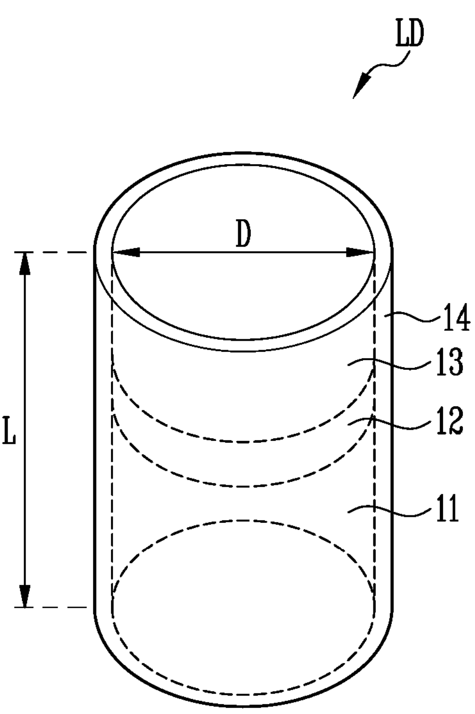
FIG. 1 is a perspective view schematically illustrating a light emitting element in accordance with an embodiment of the disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be understood that the terms "connected to" or "coupled to" may include a physical or electrical connection or coupling.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

Further, an expression that an element such as a layer, region, substrate or plate is placed "on" or "above" another element indicates not only a case where the element is placed "directly on" or "just above" the other element but also a case where a further element is interposed between the element and the other element. An expression that an element such as a layer, region, substrate or plate is placed "beneath" or "below" another element indicates not only a case where the element is placed "directly beneath" or "just below" the other element but also a case where a further element is interposed between the element and the other element.

The effects and characteristics of the disclosure and a method of achieving the effects and characteristics will be clear by referring to the embodiments described below in detail together with the accompanying drawings. However, the disclosure is not limited to the embodiments disclosed herein but may be implemented in various forms. In the entire specification, when an element is referred to as being "connected" or "coupled" to another element, it can be directly connected or coupled to the another element or be indirectly connected or coupled to the another element with one or more intervening elements interposed therebetween. In an embodiment of the disclosure, the term "connection" between two components may include electrical connection and/or physical connection.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
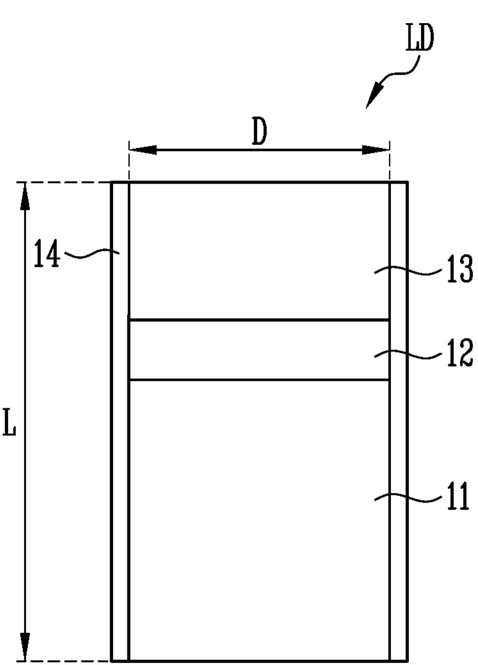
FIG. 2 is a schematic sectional view of the light emitting element shown in FIG. 1.

FIG. 1 is a perspective view schematically illustrating a light emitting element in accordance with an embodiment of the disclosure. FIG. 2 is a schematic sectional view of the light emitting element shown in FIG. 1.

In an embodiment of the disclosure, the kind and/or shape of the light emitting element LD is not limited to an embodiment shown in FIGS. 1 and 2.

Referring to FIGS. 1 and 2, the light emitting element LD may include a first semiconductor layer 11, a second semiconductor layer 13, and an active layer 12 interposed between the first and second semiconductor layers 11 and 13. In an example, the light emitting element LD may be implemented with a light emitting stack structure in which the first semiconductor layer 11, the active layer 12, and the second semiconductor layer 13 are sequentially stacked on each other.

The light emitting element LD may be provided in a shape extending in a direction. Assuming an extending direction of the light emitting element LD is a length direction, the light emitting element LD may include an end portion (or bottom end portion) and another end portion (or top end portion) along the extending direction. Any one semiconductor layer selected from the first and second semiconductor layers 11 and 13 may be located (disposed) at the end portion (or bottom end portion) of the light emitting element LD, and the other semiconductor layer selected from the first and second semiconductor layers 11 and 13 may be located at another end portion (or top end portion) of the light emitting element LD. In an example, the first semiconductor layer 11 may be located at the end portion (or bottom end portion) of the light emitting element LD, and the second semiconductor layer 13 may be located at another end portion (or top end portion) of the light emitting element LD.

The light emitting element LD may be provided in various shapes. In an example, the light emitting element LD may have a rod-like shape, a bar-like shape, a pillar-like shape, or the like, which may be long in a length L direction (i.e., its aspect ratio may be greater than 1) as shown in FIG. 1. In an embodiment of the disclosure, a length L of the light emitting element LD in the length L direction may be larger than a diameter D (or a width of a cross-section) of the light emitting element LD. However, the disclosure is not limited thereto. In some embodiments, the light emitting element LD may have a rod-like shape, a bar-like shape, a pillar-like shape, or the like, which may be short in a length L direction (i.e., its aspect ratio may be smaller than 1). Also, the light emitting element LD may have a rod-like shape, a bar-like shape, a pillar-like shape, or the like, of which a length L and a diameter D may be the same.

The light emitting element LD may include, for example, a light emitting diode (LED) manufactured small enough to have a diameter D and/or a length L to a degree of nanometer scale to micrometer scale.

In case that the light emitting element LD is long in its length L direction (i.e., its aspect ratio may be greater than 1), the diameter D of the light emitting element LD may be about 0.5 μm to about 6 μm, and the length L of the light emitting element LD may be about 1 μm to about 10 μm. However, the diameter D and the length L of the light emitting element LD are not limited thereto, and the size of the light emitting element LD may be changed to accord with requirement conditions (or design conditions) of a lighting device or a self-luminous display device, to which the light emitting element LD may be applied.

The first semiconductor layer 11 may include, for example, at least one n-type semiconductor layer. For example, the first semiconductor layer 11 may include at least one semiconductor material among InAlGaN, GaN, AlGaN, InGaN, AlN, and InN, and include an n-type semiconductor layer doped with a first conductive dopant (or n-type dopant) such as Si, Ge and/or Sn. However, the material (or substance) constituting the first semiconductor layer 11 is not limited thereto. The first semiconductor layer 11 may be configured with various materials. The first semiconductor layer 11 may include an upper surface in contact with the active layer 12 and a lower surface exposed to the outside along the length direction of the light emitting element LD. The lower surface of the first semiconductor layer 11 may be the end portion (or bottom end portion) of the light emitting element LD.

The active layer 12 may be formed on the first semiconductor layer 11, and may be formed in a single or multiple quantum well structure. In an example, in case that the active layer 12 is formed in the multiple quantum well structure, a barrier layer (not shown), a strain reinforcing layer, and a well layer, which may constitute one unit, may be periodically and repeatedly stacked on each other in the active layer 12. The strain reinforcing layer may have a lattice constant smaller than that of the barrier layer, to further reinforce strain, e.g., compressive strain applied to the well layer. However, the structure of the active layer 12 is not limited to the above-described embodiment.

The active layer 12 may emit light having a wavelength of 400 nm to 900 nm, and use a double hetero structure. In an embodiment of the disclosure, a clad layer (not shown) doped with a conductive dopant may be formed on the top and/or the bottom of the active layer 12 along the length L direction of the light emitting element LD. In an example, the clad layer may be formed as an AlGaN layer or InAlGaN layer. In some embodiments, a material such as AlGaN or AlInGaN may be used to form the active layer 12. The active layer 12 may be configured with various materials. The active layer 12 may include a first surface in contact with the first semiconductor layer 11 and a second surface in contact with the second semiconductor layer 13.

In case that an electric field having a voltage or more is applied to both the end portions of the light emitting element LD, the light emitting element LD may emit light as electron-hole pairs are combined in the active layer 12. The light emission of the light emitting element LD may be controlled by using such a principle, so that the light emitting element LD can be used as a light source (or light emitting source) for various light emitting devices, including a pixel of a display device.

The second semiconductor layer 13 may be formed on the second surface of the active layer 12, and may include a semiconductor layer having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN, and include a p-type semiconductor layer doped with a second conductive dopant (or p-type dopant) such as Mg, Zn, Ca, Sr and/or Ba. However, the material constituting the second semiconductor layer 13 is not limited thereto. The second semiconductor layer 13 may be configured with various materials. The second semiconductor layer 13 may include a lower surface in contact with the second surface of the active layer 12 and an upper surface exposed to the outside along the length L direction of the light emitting element LD. The upper surface of the second semiconductor layer 13 may be the other end portion (or top end portion) of the light emitting element LD.

In an embodiment of the disclosure, the first semiconductor layer 11 and the second semiconductor layer 13 may have different thicknesses in the length L direction of the light emitting element LD. In an example, the first semiconductor layer 11 may have a thickness relatively thicker than that of the second semiconductor layer 13 along the length L direction of the light emitting element LD. Accordingly, the active layer 12 of the light emitting element LD may be located more adjacent to the upper surface of the second semiconductor layer 13 than the lower surface of the first semiconductor layer 11.

Although it is illustrated that each of the first semiconductor layer 11 and the second semiconductor layer 13 is configured with one layer, the disclosure is not limited thereto. In an embodiment of the disclosure, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR may be configured with a p-type semiconductor layer such as p-GAInP, p-AlInP or p-AlGaInP, but the disclosure is not limited thereto.

In some embodiments, the light emitting element LD may further include a contact electrode (not shown) (hereinafter, referred to as a "first contact electrode") disposed on the top of the second semiconductor layer 13, in addition to the first semiconductor layer 11, the active layer 12, and the second semiconductor layer 13, which are described above. In other embodiments, the light emitting element LD may further include another contact electrode (not shown) (hereinafter, referred to as a "second contact electrode") disposed at an end of the first semiconductor layer 11.

Each of the first and second contact electrodes may be an ohmic contact electrode, but the disclosure is not limited thereto. In some embodiments, each of the first and second contact electrodes may be a Schottky contact electrode. The first and second contact electrodes may include a conductive material. For example, the first and second contact electrodes may include an opaque metal using one or a mixture of chromium (Cr), titanium (Ti), aluminum (Al), gold (Au), nickel (Ni), and any oxide or alloy thereof, but the disclosure is not limited thereto. In some embodiments, the first and second contact electrodes may include a transparent conductive oxide such as indium tin oxide (ITO), indium zinc oxide (IZO), zinc oxide (ZnO), indium gallium zinc oxide (IGZO), and/or indium tin zinc oxide (ITZO).

Materials respectively included in the first and second contact electrodes may be identical to or different from each other. The first and second contact electrodes may be substantially transparent or translucent. Accordingly, light generated in the light emitting element LD can be emitted to the outside of the light emitting element LD by passing through the first and second contact electrodes. In some embodiments, in case that light generated in the light emitting element LD does not pass through the first and second contact electrodes and is emitted to the outside of the light emitting element LD through an area except both the end portions of the light emitting element LD, the first and second contact electrodes may include an opaque metal.

In an embodiment of the disclosure, the light emitting element LD may further include an insulative film 14 (or insulating film). However, in some embodiments, the insulative film 14 may be omitted, and be provided to cover (or surround) only portions of the first semiconductor layer 11, the active layer 12, and the second semiconductor layer 13.

The insulative film 14 can prevent an electrical short circuit which may occur in case that the active layer 12 is in contact with a conductive material in addition to the first semiconductor layer 11 and the second semiconductor layer 13. Also, the insulative film 14 minimizes a surface defect of the light emitting element LD, thereby improving the lifetime and light emission efficiency of the light emitting element LD. Also, in case that multiple light emitting elements LD are densely disposed, the insulative film 14 can prevent an unwanted short circuit which may occur between the light emitting elements LD. Whether the insulative film is provided is not limited as long as the active layer 12 can prevent occurrence of a short circuit with external conductive material.

The insulative film 14 may be provided in a shape entirely surrounding (covering) the outer circumference of the light emitting stack structure including the first semiconductor layer 11, the active layer 12, and the second semiconductor layer 13.

Although a case where the insulative film 14 is provided in a shape entirely surrounding the outer circumference of each of the first semiconductor layer 11, the active layer 12, and the second semiconductor layer 13 is described in the above-described embodiment, the disclosure is not limited thereto. In some embodiments, in case that the light emitting element LD includes the first contact electrode, the insulative film 14 may entirely surround the outer circumference of each of the first semiconductor layer 11, the active layer 12, the second semiconductor layer 13, and the first contact electrode. In other embodiments, the insulative film 14 may not entirely surround the outer circumference of the first contact electrode, or may surround only a portion of the outer circumference of the first contact electrode and may not surround the other of the outer circumference of the first contact electrode. In some embodiments, in case that the first contact electrode is disposed at another end portion (or top end portion) of the light emitting element LD and the second contact electrode is disposed at an end portion (or bottom end portion) of the light emitting element LD, the insulative film 14 may expose at least one area of each of the first and second contact electrodes.

The insulative film 14 may include a transparent insulating material. For example, the insulative film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium dioxide ($TiO_2$), hafnium oxide ($HfO_x$), titanium strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($NbxO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the disclosure is not limited thereto, and various materials having insulating properties may be used as the material of the insulative film 14.

The insulative film 14 may be provided in the form of a single layer or be provided in the form of a multi-layer including at least two layers. In an example, in case that the insulative film 14 may be configured as a double layer including a first layer and a second layer, which may be sequentially stacked on each other, the first layer and the second layer may be made of different materials, and be formed through different processes. In some embodiments, the first layer and the second layer may be formed of the same material through a continuous process.

In some embodiments, the light emitting element LD may be implemented with a light emitting pattern having a core-shell structure. The first semiconductor layer 11 may be located at a core, i.e., in the middle (or center) of the light emitting element LD, the active layer 12 may be provided and/or formed in a shape surrounding the outer circumference of the first semiconductor layer 11, and the second semiconductor layer 13 may be provided and/or formed in a shape surrounding the active layer 12. Also, the light emitting element LD may further include a contact electrode (not shown) surrounding at least one side of the second semiconductor layer 13. In some embodiments, the light emitting element LD may further include an insulative film which is provided on the outer circumference of the light emitting pattern having the core-shell structure and includes a transparent insulating material. The light emitting element LD implemented with the light emitting pattern having the core-shell structure may be manufactured through a growth process.

The above-described light emitting element LD may be used as a light emitting source (or light source) for various display devices. The light emitting element LD may be manufactured through a surface treatment process. For example, in case that light emitting elements LD are mixed in a liquid solution (or solvent) to be supplied to each pixel area (e.g., an emission area of each pixel or an emission area of each sub-pixel), each light emitting element LD may be surface-treated such that the light emitting elements LD are not unequally condensed in the solution but equally dispersed In the solution.

A light emitting unit (or light emitting device) including the above-described light emitting element LD may be used in various types of devices that require a light source, including a display device. In case that multiple light emitting elements LD are disposed in an emission area of each pixel of a display panel, the light emitting elements LD may be used as a light source of the pixel. However, the application field of the light emitting element LD is not limited to the above-described example. For example, light emitting elements LD may be used for other types of electronic devices that require a light source, such as a lighting device.

Figure 3:
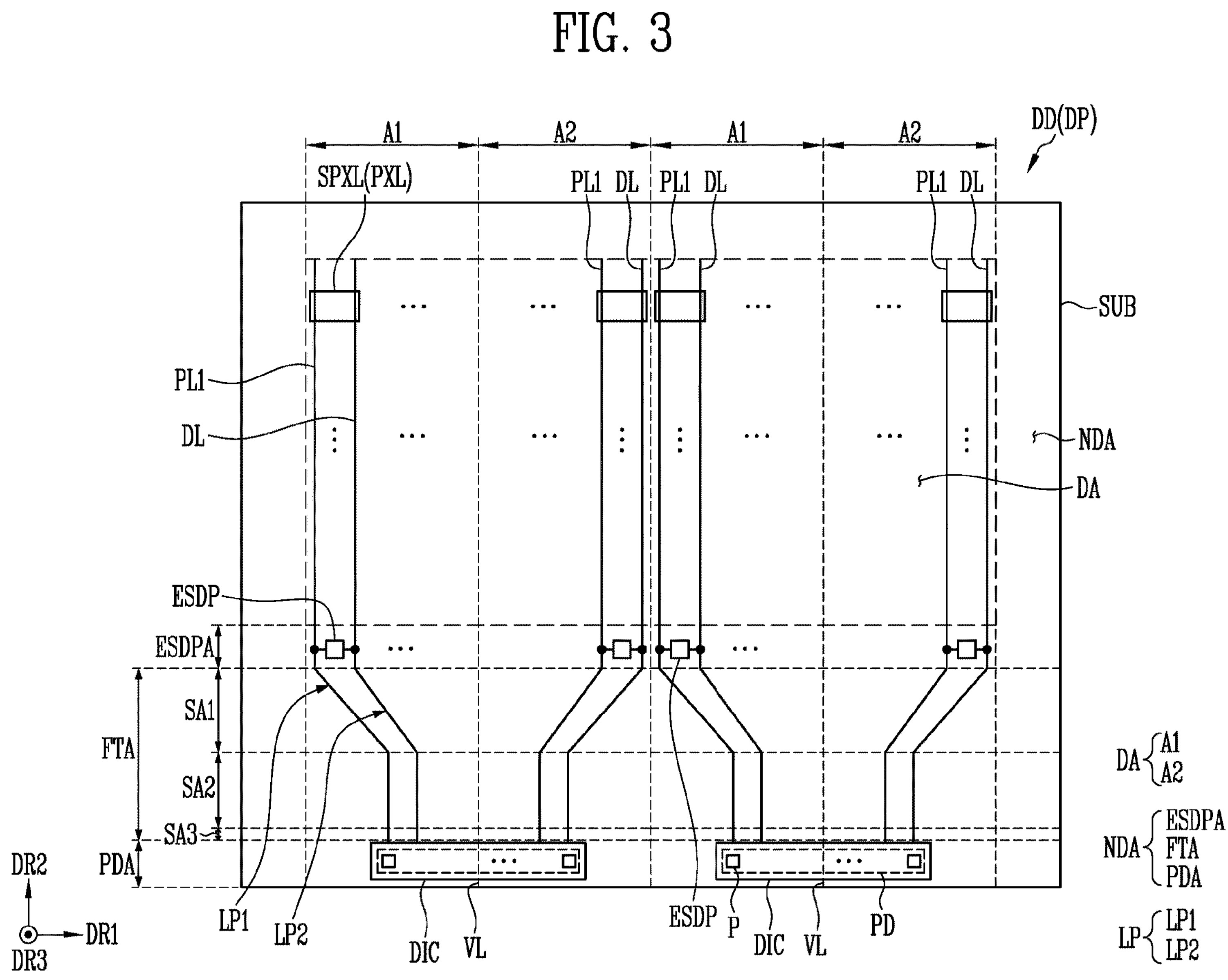
FIG. 3 is a plan view schematically illustrating a display device in accordance with an embodiment of the disclosure.

FIG. 3 is a plan view schematically illustrating a display device in accordance with an embodiment of the disclosure. For convenience of description, only a partial configuration of the display device DD is schematically illustrated in FIG. 3.

The disclosure may be applied as long as the display device DD (or display panel DP) is an electronic device in which a display surface is applied to at least one surface thereof, such as a smartphone, a television, a tablet personal computer (PC), a mobile phone, a video phone, an electronic book reader, a desktop PC, a laptop PC, a netbook computer, a workstation, a server, a personal digital assistant (PDA), a portable multimedia player (PMP), an MP3 player, a medical device, a camera, or a wearable device.

Referring to FIGS. 1 to 3, the display device DD in accordance with an embodiment of the disclosure may include a substrate SUB, sub-pixels SPXL (or pixels PXL), and a line part.

The display device DD may be classified into a passive matrix type display device and an active matrix type display device according to a method of driving a light emitting element LD. In an example, in case that the display device DD is implemented as the active matrix type display device, each sub-pixel SPXL may include a driving transistor for controlling an amount of current supplied to the light emitting element LD, a switching transistor for transferring a data signal to the driving transistor, and the like.

The display device DD may be provided in various shapes. In an example, the display device may be provided in a rectangular plate shape having two pairs of sides parallel to each other, but the disclosure is not limited thereto. In case that the display device DD is provided in the rectangular plate shape, any one pair of sides among the two pairs of sides may be provided longer than the other pair of sides. For convenience, a case where the display device is provided in a rectangular shape having a pair of long sides and a pair of short sides is illustrated. An extending direction of the long sides is represented as a first direction DR1, an extending direction of the short sides is represented as a second direction DR2, and a direction perpendicular to the extending directions of the long sides and the short sides is represented as a third direction DR3. In the display device DD provided in the rectangular plate shape, a corner portion at which one long side and one short side are in contact with (or meet) each other may have a round shape, but the disclosure is not limited thereto.

The substrate SUB may include the display area DA and a non-display area NDA. The display area DA may be an area in which the sub-pixels SPXL for displaying an image may be provided.

The substrate SUB may include a transparent insulating material to enable light to be transmitted therethrough. The substrate SUB may be a rigid substrate or a flexible substrate.

Each sub-pixel SPXL and signal lines connected to the sub-pixel SPXL may be disposed in the display area DA. The signal lines may include a first power line PL1 and a data line DL.

The sub-pixel SPXL may be connected to the first power line PL1 and the data line DL. The sub-pixel SPXL may emit light with a luminance corresponding to a current (or current amount) provided from the first power line PL1 in response to a data signal provided through the data line DL. The sub-pixel SPXL may include at least one light emitting element driven by the current. The light emitting element may include an inorganic light emitting diode, and the inorganic light emitting diode may have a size small to a degree of nanometer scale to micrometer scale. The sub-pixel SPXL may include the light emitting element LD shown in FIGS. 1 and 2. However, the disclosure is not limited thereto, and the light emitting element may include an organic light emitting diode.

The sub-pixels SPXL may be arranged in a stripe arrangement structure or a PenTile® arrangement structure in the display area DA, but the disclosure is not limited thereto.

Each pixel PXL may include at least one sub-pixel SPXL, and display a full-color image.

The first power line PL1 may extend in a direction, e.g., the second direction DR2. The first power line PL1 may be arranged at a distance of at least one sub-pixel SPXL (or pixel PXL) along the first direction DR1. In some embodiments, the first power line PL1 provided to the sub-pixel SPXL may be connected to a first power line PL1 provided to an adjacent sub-pixel adjacent to the sub-pixel SPXL in the first direction DR1. In other words, the first power line PL1 may be arranged in a mesh shape (or lattice shape) throughout the entire substrate SUB.

A driving voltage for driving the sub-pixel SPXL may be supplied to the first power line PL1. In case that the display device DD is driven, a voltage of a first driving power source (e.g., a high-potential driving power source) may be supplied to the first power line PL1.

Similarly to the first power line PL1, the data line DL may extend in the direction, e.g., the second direction DR2. The data line DL may be arranged along the first direction DR1.

Lines, pads, and/or a built-in circuit, which may be electrically connected to the sub-pixel SPXL to drive the sub-pixel SPXL may be provided in the non-display area NDA. In an example, fan-out lines LP, a pad part PD, and a driver DIC may be provided in the non-display area NDA.

The non-display area NDA may be provided at at least one side of the display area DA. The non-display area NDA may surround a circumference (, periphery or edge) of the display area DA.

The fan-out line LP may electrically connect the driver (or the pad part PD) and the sub-pixel SPXL to each other. In an example, the fan-out line LP may be connected to the data line DL, a scan line, an emission control line, and the like. Also, the fan-out line LP may also be connected to signal lines, e.g., a control line, a sensing line, and the like, which may be connected to the sub-pixel SPXL so as to compensate for an electrical characteristic change of the sub-pixel SPXL in real time.

The fan-out line LP (or line part) may include a first fan-out line LP1 (or first driving voltage line) and a second fan-out line LP2. The first fan-out line LP1 may be connected between the first power line PL1 and the pad part PD (or a first power pad of the pad part PD), and transfer the voltage of the first driving power source to the first power line PL1 in driving of the display device DD. The second fan-out line LP2 may be connected between the data line DL and the pad part PD (or a data pad of the pad part PD), and transfer a data signal to the data line DL in driving of the display device DD.

The pad part PD may include multiple pads P. The pads P may supply (or transfer) driving power sources and signals, which may be used to drive the sub-pixel SPXL provided in the display area DA and/or the built-in circuit.

At least one of the pads P may be the first power pad. The first power pad may be connected to the first fan-out line LP1 (or first driving voltage line).

The driver DIC may be located on the pad part PD. The driver DIC may include input/output pads (not shown) connected to the pads P included in the pad part PD. In an example, the driver DIC may be an integrated circuit (IC). The driver DIC may receive driving signals output from a printed circuit board (not shown), and output signals, a voltage of a driving power source, and the like, which may be provided to the pixels PXL, based on the received driving signals. The signals and the voltage of the driving power source, which are described above, may be supplied to a corresponding pad P of the pad part PD through some of the input/output pads. In some embodiments, the driver DIC may include a power supply pad connected to the first power pad to supply the voltage of the first driving power source to the first power pad in driving of the display device DD.

In the above-described embodiment, it has been described that the driver DIC is disposed on the pad part PD. However, the disclosure is not limited thereto. In some embodiments, the driver DIC may be disposed on a circuit board (not shown), and be connected to the pad part PD through the circuit board.

The display area DA may include a first area A1 and a second area A2 with respect to a virtual line VL traversing the middle (or center) of one driver DIC along the second direction DR2. An arrangement of the fan-out line LP in the first area A1 and an arrangement of the fan-out line LP in the second area A2 may be symmetrical to each other with respect to the virtual line VL, but the disclosure is not limited thereto.

As distances between circuits and signal lines, which may be disposed in the display device DD become narrower due to high resolution of the display device DD, the probability that static electricity will occur becomes higher. In case that static electricity occurs, a pixel circuit of each sub-pixel SPXL may malfunction, or a configuration of the pixel circuit may be problematic. In order to solve this, an electrostatic discharge prevention part ESDP (or electrostatic discharge prevention circuit) electrically connected between the first power line PL1 (or the first fan-out line LP1) and the data line DL (or the second fan-out line LP2) may be provided in an area of the non-display area NDA.

The electrostatic discharge prevention part ESDP may prevent a pulse potential caused by static electricity from being introduced into an internal pixel circuit. The electrostatic discharge prevention part ESDP may be connected between the first fan-out line LP1 and the second fan-out line LP2 in the non-display area NDA to allow a pulse caused by static electricity, which is introduced into the second fan-out line LP2 (or the data line DL), to be distributed to the first fan-out line LP1 (or the first power line PL1).

In an embodiment of the disclosure, the non-display area NDA may include an electrostatic discharge prevention circuit area ESDPA in which the electrostatic discharge prevention part ESDP is located, a fan-out area FTA in which the fan-out lines LP are located, and a pad area PDA in which the pad part PD is located. In an embodiment, the fan-out area FTA may be partitioned into a first sub-area SA1, a second sub-area SA2, and a third sub-area SA3. Extending directions of the fan-out lines LP may be different from each other in the first sub-area SA1, the second sub-area SA2, and the third sub-area SA3.

Figure 4:
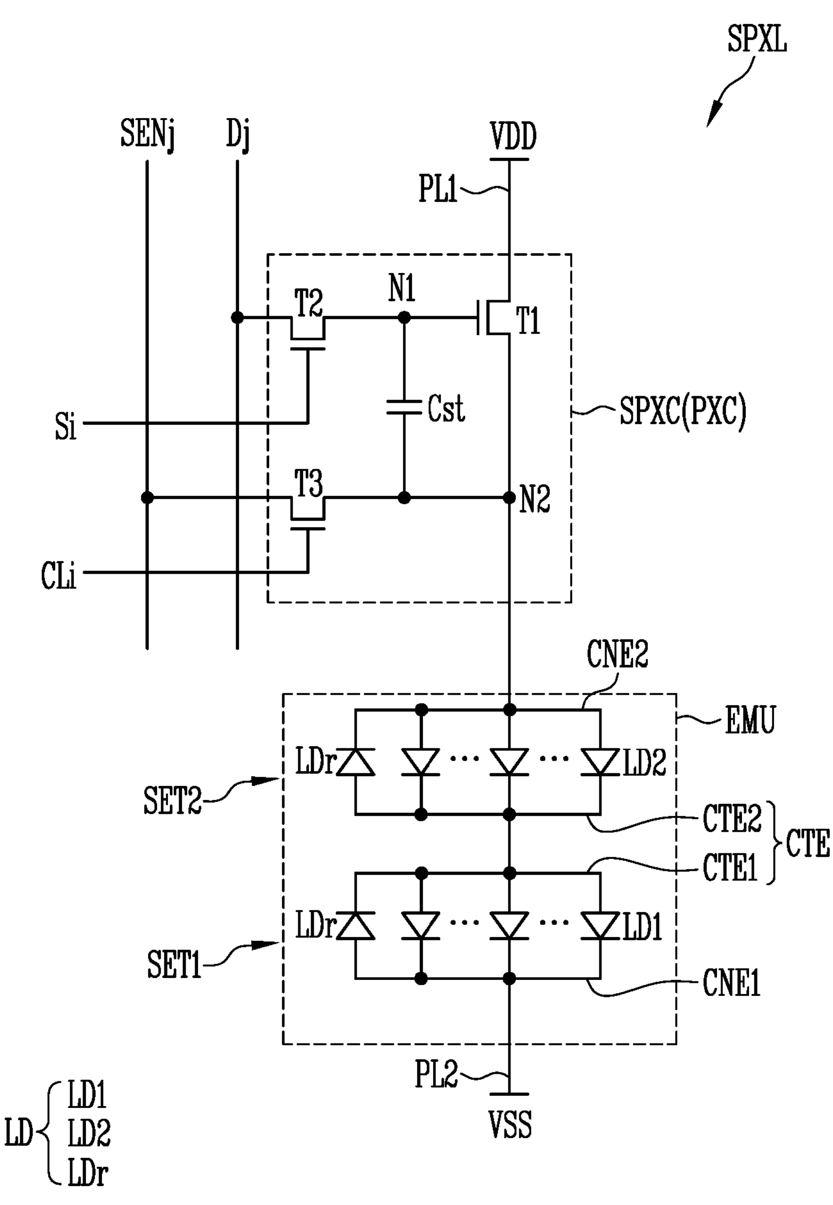
FIG. 4 is a circuit diagram schematically illustrating an embodiment of a sub-pixel included in the display device shown in FIG. 3.

FIG. 4 is a circuit diagram schematically illustrating an embodiment of the sub-pixel included in the display device shown in FIG. 3.

For example, FIG. 4 illustrates an embodiment of an electrical connection relationship between components included in a sub-pixel SPXL applicable to an active matrix type display device DD. However, the kinds of the components included in the sub-pixel SPXL applicable to an embodiment of the disclosure are not limited thereto.

In FIG. 4, the sub-pixel SPXL comprehensively includes not only components included in the sub-pixel SPXL shown in FIG. 3 but also an area in which the components are provided.

Referring to FIGS. 1 to 4, the sub-pixel SPXL may include a light emitting unit EMU (or light emitting part) which generates light with a luminance corresponding to a data signal. Also, the sub-pixel SPXL may selectively further include a sub-pixel circuit SPXC (or pixel circuit PXC) for driving the light emitting unit EMU.

In some embodiments, the light emitting unit EMU may include light emitting elements LD connected in parallel between a first power line PL1 to which a voltage of a first driving power source VDD is applied and a second power line PL2 to which a voltage of a second driving power source VSS is applied. For example, the light emitting unit EMU may include a second pixel electrode CNE2 connected to the first driving power source VDD via the sub-pixel circuit SPXC and the first power line PL1, a first pixel electrode CNE1 connected to the second driving power source VSS through a second power line PL2, and light emitting elements LD connected in parallel in the same direction between the first and second pixel electrodes CNE1 and CNE2. In an embodiment of the disclosure, the second pixel electrode CNE2 may be an anode, and the first pixel electrode CNE1 may be a cathode. The first power line PL1 may be the first power line PL1 described with reference to FIG. 3. The second power line PL2 may be arranged similarly to the first power line PL1 described with reference to FIG. 3.

Each of the light emitting elements LD included in the light emitting unit EMU may include an end portion connected to the first driving power source VDD through the second pixel electrode CNE2 and another end portion connected to the second driving power source VSS through the first pixel electrode CNE1. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set equal to or higher than a threshold voltage of the light emitting elements LD during an emission period of the sub-pixel SPXL.

The light emitting elements LD connected in parallel in the same direction (e.g., a forward direction) between the first pixel electrode CNE1 and the second pixel electrode CNE2, to which voltages having difference potentials are supplied, may form effective light sources, respectively. These effective light sources may constitute the light emitting unit EMU of the sub-pixel SPXL.

Each of the light emitting elements LD of the light emitting unit EMU may emit light with a luminance corresponding to a driving current supplied through the sub-pixel circuit SPXC. For example, the sub-pixel circuit SPXC may supply, to the light emitting unit EMU, a driving current corresponding to a grayscale value of corresponding frame data during each frame period. The driving current supplied to the light emitting unit EMU may be divided to flow through each of the light emitting elements LD. Accordingly, the light emitting unit EMU can emit light with a luminance corresponding to the driving current while each light emitting element LD is emitting light with a luminance corresponding to a current flowing therethrough.

An embodiment in which both the end portions of the light emitting elements LD are connected in the same direction between the first and second driving power sources VDD and VSS has been described, but the disclosure is not limited thereto. In some embodiments, the light emitting unit EMU may further include at least one ineffective light source, e.g., a reverse light emitting element LDr, in addition to the light emitting elements LD forming the respective effective light sources. The reverse light emitting element LDr may be connected in parallel together with the light emitting elements LD forming the effective light sources between the first and second pixel electrodes CNE1 and CNE2, and may be connected between the first and second pixel electrodes CNE1 and CNE2 in a direction opposite to that in which the light emitting elements LD are connected. Although a driving voltage (e.g., a forward driving voltage) may be applied between the first and second pixel electrodes CNE1 and CNE2, the reverse light emitting element LDr maintains an inactivated state, and accordingly, no current substantially flows through the reverse light emitting element LDr.

The sub-pixel circuit SPXC may be connected to a scan line Si and a data line Dj of the sub-pixel PXL. In an example, in case that a sub-pixel SPXL may be disposed on an ith row and a jth column of the display area DA, a sub-pixel circuit SPXC of the sub-pixel SPXL may be connected an ith scan line Si, and a jth data line Dj of the display area DA. The data line Dj may be the data line DL described with reference to FIG. 3. Also, the sub-pixel circuit SPXC may be connected to an ith control line CLi (or sensing scan line) and a jth sensing line SENj (readout line, or initialization power line) of the display area DA.

The above-described sub-pixel circuit SPXC may include first, second, and third thin film transistors T1 to T3 (or transistors) and a storage capacitor Cst.

The first thin film transistor T1 may be a driving transistor for controlling a driving current applied to the light emitting unit EMU, and may be connected between the first driving power source VDD and the light emitting unit EMU. Specifically, a first terminal of the first thin film transistor T1 may be connected (or coupled) to the first driving power source VDD through the first power line PL1, a second terminal of the first thin film transistor T1 may be connected to a second node N2, and a gate electrode of the first thin film transistor T1 may be connected to a first node N1. The first thin film transistor T1 may control an amount of driving current applied to the light emitting unit EMU through the second node N2 from the first driving power source VDD according to a voltage applied to the first node N1. In an embodiment, the first terminal of the first thin film transistor T1 may be a drain electrode, and the second terminal of the first thin film transistor T1 may be a source electrode. However, the disclosure is not limited thereto. In some embodiments, the first terminal may be the source electrode, and the second terminal may be the drain electrode.

The second thin film transistor T2 may be a switching transistor which selects a sub-pixel SPXL in response to a scan signal and activates the sub-pixel SPXL, and may be connected between the data line Dj and the first node N1. A first terminal of the second thin film transistor T2 may be connected to the data line Dj, a second terminal of the second thin film transistor T2 may be connected to the first node N1, and a gate electrode of the second thin film transistor T2 may be connected to the scan line Si. The first terminal and the second terminal of the second thin film transistor T2 may be different terminals. For example, in case that the first terminal is a drain electrode, the second terminal may be a source electrode.

The second thin film transistor T2 may be turned on in case that a scan having a gate-on voltage (e.g., a high level voltage) is supplied from the scan line Si, to electrically connect the data line Dj and the first node N1 to each other. The first node N1 may be a point at which the second terminal of the second thin film transistor T2 and the gate electrode of the first thin film transistor T1 are connected to each other, and the second thin film transistor T2 may transfer a data voltage to the gate electrode of the first thin film transistor T1.

A second terminal of the third thin film transistor T3 may be connected to the second terminal of the first thin film transistor T1, a first terminal of the third thin film transistor T3 may be connected to the sensing line SENj, and a gate electrode of the third thin film transistor T3 may be connected to the control line CLj. A voltage of an initialization power source may be applied to the sensing line SENj. The third thin film transistor T3 may be an initialization transistor capable of initializing the second node N2, and may be turned on in case that a sensing control signal is supplied from the control line CLi, to transfer the voltage of the initialization power source to the second node N2. Accordingly, a second storage electrode (or upper electrode) of the storage capacitor Cst, which may be connected to the second node N2, may be initialized. In some embodiments, the third thin film transistor T3 may connect the first thin film transistor T1 to the sensing line SENj, to acquire a sensing signal through the sensing line SENj and to detect a characteristic of each sub-pixel SPXL, including a threshold voltage of the first thin film transistor T1, and the like, by using the sensing signal. Information on the characteristic of each sub-pixel SPXL may be used to convert image data such that a characteristic deviation between sub-pixels SPXL can be compensated.

The storage capacitor Cst may be formed or electrically connected between the first node N1 and the second node N2. A first storage electrode (or lower electrode) of the storage capacitor Cst may be connected to the first node N1, and the second storage electrode of the storage capacitor Cst may be connected to the second node N2. The storage capacitor Cst charges a data voltage corresponding to a data signal supplied to the first node N1 during one frame period. Accordingly, the storage capacitor Cst may store a voltage corresponding to the difference between a voltage of the gate electrode of the first thin film transistor T1 and a voltage of the second node N2.

The light emitting unit EMU may be configured to include at least one serial stage (or stage) including light emitting elements LD connected in parallel to each other. For example, the light emitting unit EMU may be configured in a series/parallel hybrid structure as shown in FIG. 4.

The light emitting unit EMU may include first and second serial stages SET1 and SET2 (or stages) sequentially connected between the first and second driving power sources VDD and VSS. However, this is merely illustrative, and the number of serial stages included in the light emitting unit EMU is not limited thereto. For example, the light emitting unit EMU may include three or more serial stages.

Each of the first and second serial stages SET1 and SET2 may include two electrodes CNE1 and CTE1 or CTE2 and CNE2 constituting an electrode pair of the corresponding serial stage, and light emitting elements LD connected in parallel in the same direction between the two electrodes CNE1 and CTE1 or CTE2 and CNE2.

The first serial stage SET1 may include the first pixel electrode CNE1 and a first intermediate electrode CTE1, and include at least one first light emitting element LD1 connected between the first pixel electrode CNE1 and the first intermediate electrode CTE1. Also, the first serial stage SET1 may include a reverse light emitting element LDr connected in a direction opposite to the direction in which the first light emitting element LD1 is connected between the first pixel electrode CNE1 and the first intermediate electrode CTE1.

The second serial stage SET2 may include a second intermediate electrode CTE2 and the second pixel electrode CNE2, and include at least one second light emitting element LD2 connected between the second intermediate electrode CTE2 and the second pixel electrode CNE2. Also, the second serial stage SET2 may include a reverse light emitting element LDr connected in a direction opposite to the direction in which the second light emitting element LD2 is connected between the second intermediate electrode CTE2 and the second pixel electrode CNE2.

The first intermediate electrode CTE1 of the first serial stage SET1 and the second intermediate electrode CTE2 of the second serial stage SET2 may be integrally provided to be connected to each other. For example, the first intermediate electrode CTE1 and the second intermediate electrode CTE2 may constitute an intermediate electrode CTE electrically connecting the first serial stage SET1 and the second serial stage SET2, which may be consecutive. In case that the first intermediate electrode CTE1 and the second intermediate electrode CTE2 are integrally provided, the first intermediate electrode CTE1 and the second intermediate electrode CTE2 may be different areas of the intermediate electrode CTE.

In the above-described embodiment, the first pixel electrode CNE1 of the first serial stage SET1 may be a cathode of a light emitting unit EMU of each sub-pixel SPXL, and the second pixel electrode CNE2 of the second serial stage SET2 may be an anode of the light emitting unit EMU.

As described above, the light emitting unit EMU of the sub-pixel SPXL, which includes the serial stages SET1 and SET2 (or the light emitting elements LD) connected in the series/parallel hybrid structure, can readily control driving current/voltage conditions to be suitable for specifications of a product to which the light emitting unit EMU may be applied.

In particular, the light emitting unit EMU of the sub-pixel SPXL, which includes the serial stages SET1 and SET2 (or the light emitting elements LD) connected in the series/parallel hybrid structure, can decrease a driving current, as compared with a light emitting unit having a structure in which light emitting elements LD are connected only in parallel. The light emitting unit EMU of the sub-pixel SPXL, which includes the serial stages SET1 and SET2 connected in the series/parallel hybrid structure, can decrease a driving voltage applied to both ends of the light emitting unit EMU, as compared with a light emitting unit having a structure in which the same number of light emitting elements LD are connected only in series. Further, the light emitting unit EMU of the sub-pixel SPXL, which includes the serial stages SET1 and SET2 (or the light emitting elements LD) connected in the series/parallel hybrid structure, can include a larger number of light emitting elements LD between the same number of electrodes CNE1, CTE1, CTE2, and CNE2, as compared with a light emitting unit having a structure in which serial stages (or stages) are all connected in series. Thus, the light emission efficiency of the light emitting element LD can be improved, and the ratio of light emitting elements LD which do not emit light due to a failure can be relatively decreased even in case that the failure occurs in a specific serial stage (or stage). Accordingly, the deterioration of the light emission efficiency of light emitting elements LD can be reduced.

Although an embodiment in which the first to third transistors T1, T2, and T3 are all N-type transistors is illustrated in FIG. 4, the disclosure is not limited thereto. For example, at least one of the first to third transistors T1, T2, and T3 may be replaced with a P-type transistor. Also, although an embodiment in which the light emitting unit EMU may be connected between the sub-pixel circuit SPXC and the second driving power source VSS is illustrated in FIG. 4, the light emitting unit EMU may be connected between the first driving power source VDD and the sub-pixel circuit SPXC.

The structure of the sub-pixel circuit SPXC may be variously modified and embodied. In an example, the sub-pixel circuit SPXC may additionally further include at least one transistor element such as a transistor element for initializing the first node N1 and/or a transistor element for controlling an emission time of the light emitting elements LD, or other circuit elements such as a boosting capacitor for boosting the voltage of the first node N1.

The structure of a sub-pixel SPXL applied to the disclosure is not limited to the embodiments shown in FIG. 4, and the corresponding sub-pixel SPXL may have various structures. For example, each sub-pixel SPXL may be configured in a passive type light emitting display device, or the like. The sub-pixel circuit SPXC may be omitted, and both end portions of the light emitting element LD included in the light emitting unit EMU may be directly connected to the scan line Si, the data line Dj, the first power line PL1 to which the voltage of the first driving power source VDD is applied, the second power line PL2 to which the voltage of the second driving power source VSS is applied, and/or a control line.

Figure 5:
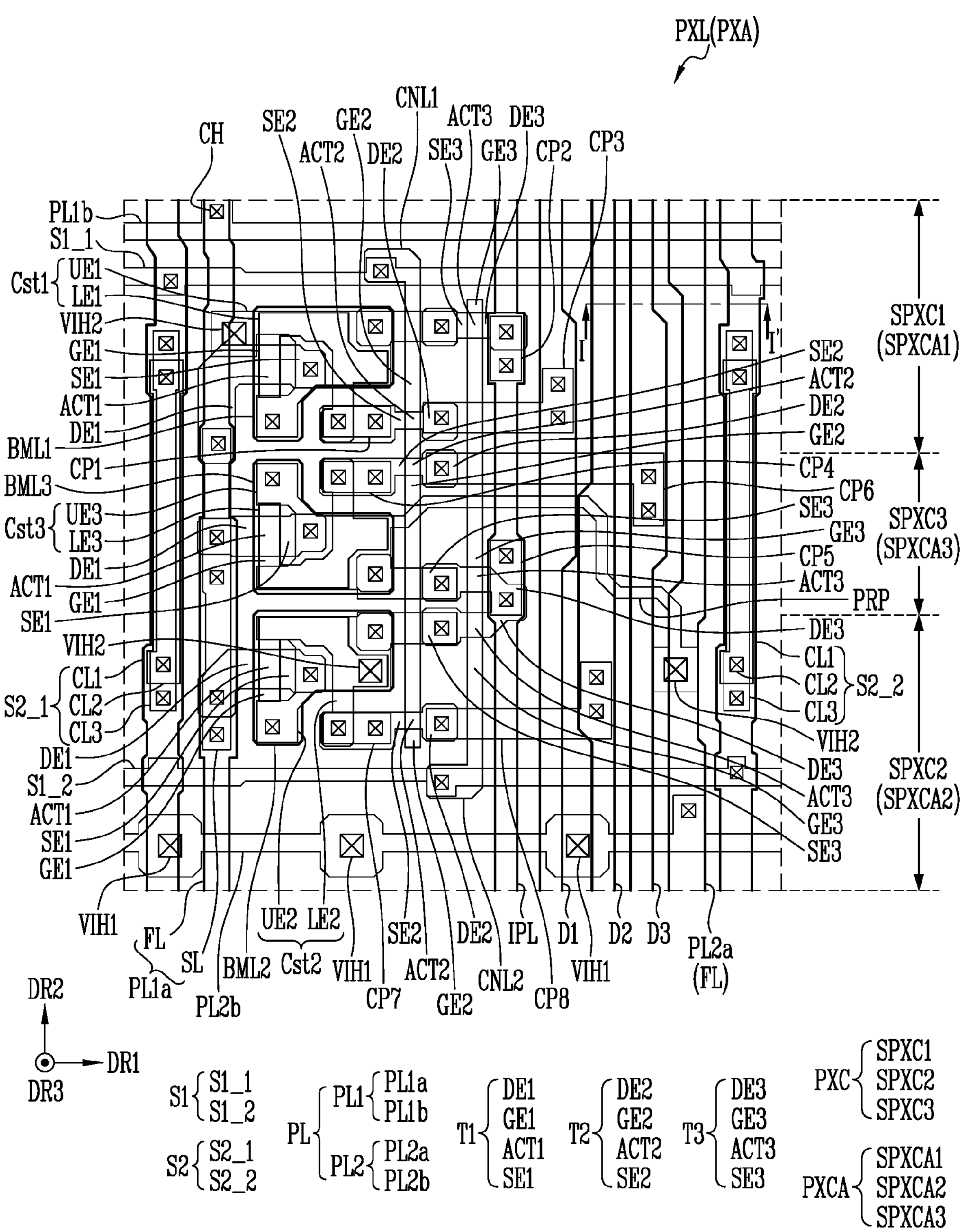
FIGS. 5 and 6 are plan views schematically illustrating a pixel included in the display device shown in FIG. 3.
Figure 6:
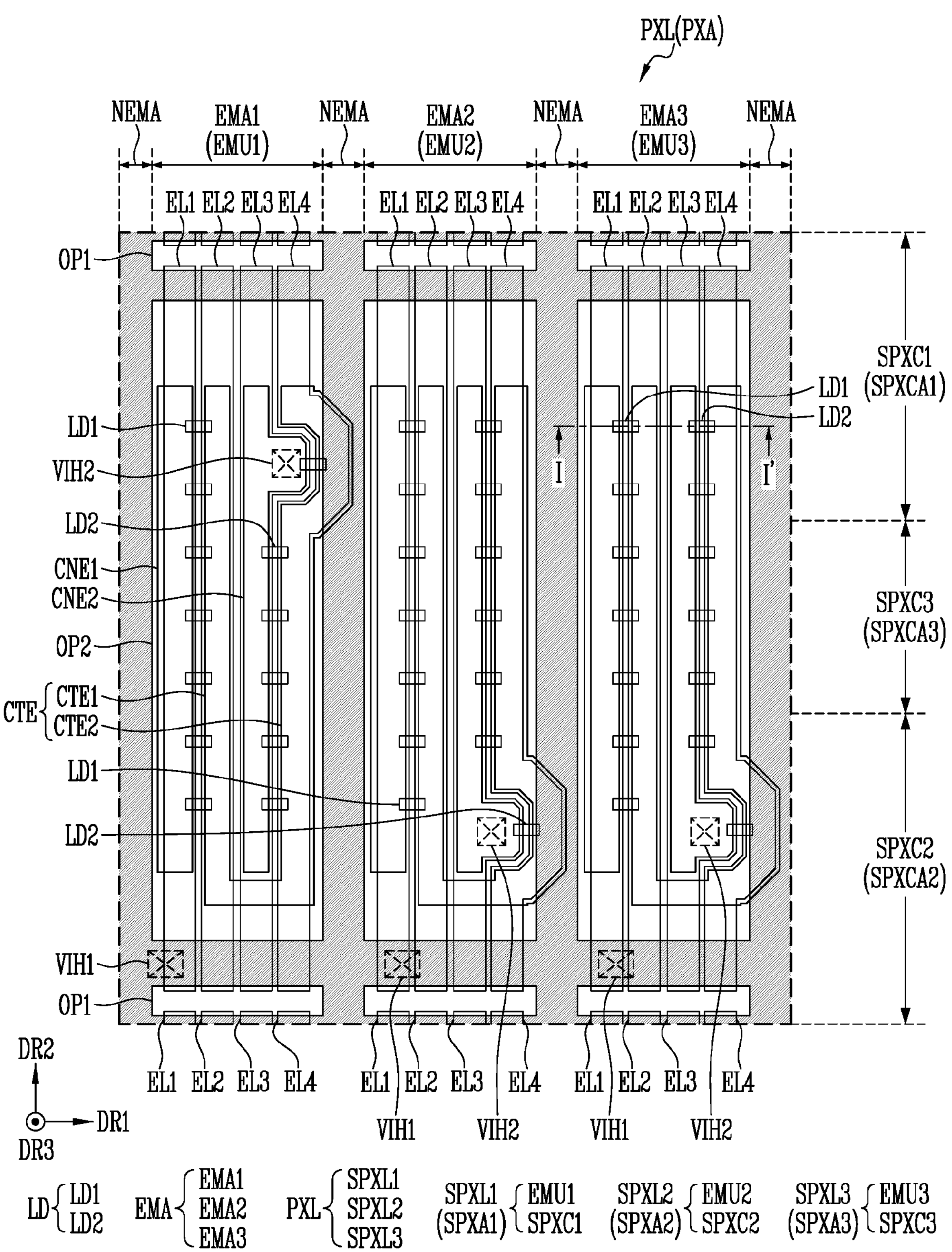
Figure 7:
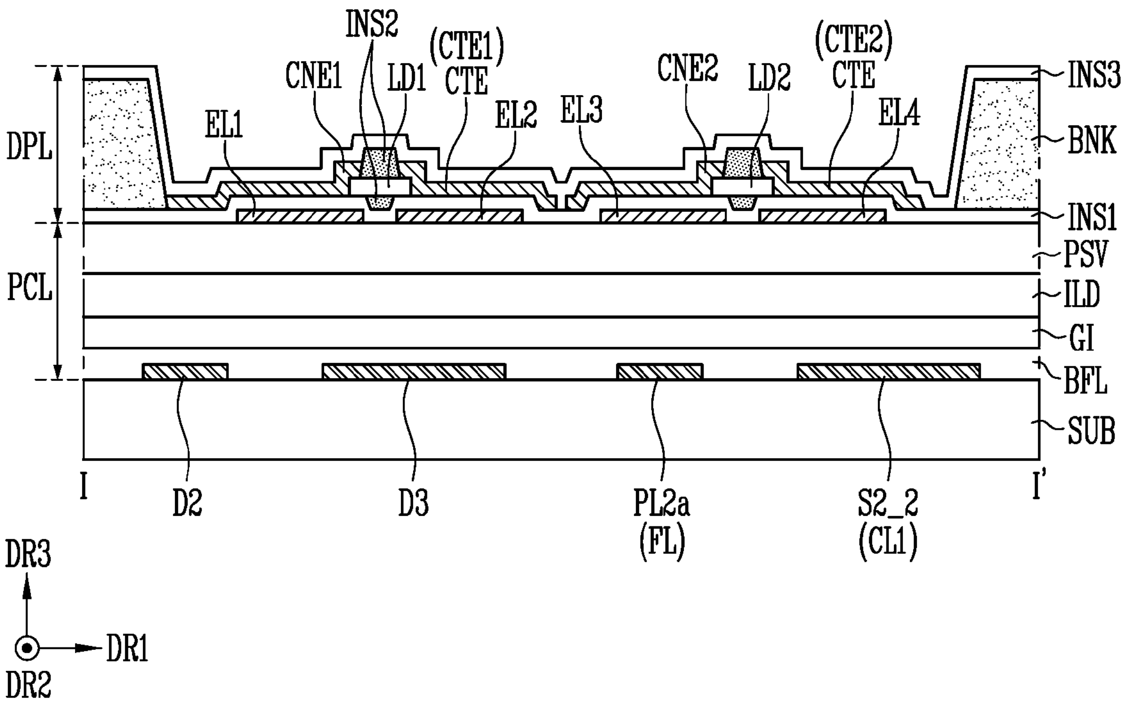
FIGS. 7 and 8 are schematic sectional views taken along line I-I' shown in FIGS. 5 and 6.
Figure 8:
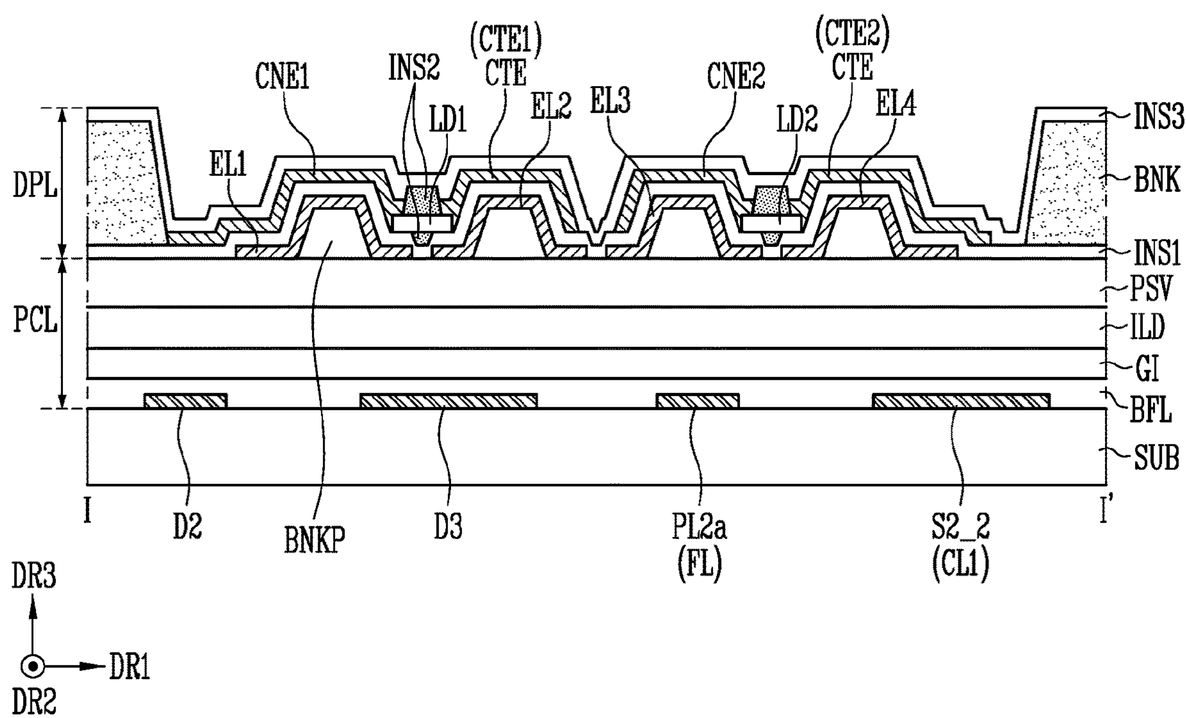

FIGS. 5 and 6 are plan views schematically illustrating the pixel included in the display device shown in FIG. 3. FIGS. 7 and 8 are schematic sectional views taken along line I-I' shown in FIGS. 5 and 6. In FIG. 5, the pixel PXL is illustrated based on the sub-pixel circuit SPXC (or pixel circuit PXC) shown in FIG. 4. In FIG. 6, the pixel PXL is illustrated based on the light emitting unit EMU shown in FIG. 4.

In FIGS. 5 to 8, a pixel PXL is simplified and illustrated, such as that each electrode is illustrated as an electrode provided as a signal layer and each insulating layer is illustrated as an insulating layer provided as a single layer, but the disclosure is not limited thereto.

In embodiments of the disclosure, the term "being formed and/or provided in the same layer" may mean being formed in the same process, and the term "being formed and/or provided in different layers" may mean being formed in different processes.

In FIGS. 5 to 8, a lateral direction (or horizontal direction) on a plane is represented as a first direction DR1, a longitudinal direction (or vertical direction) on a plane is represented as a second direction DR2, and a thickness direction of the substrate SUB on a section is represented as a third direction DR3. The first, second, and third directions DR1, DR2, and DR3 may mean directions respectively indicated by the first, second, and third directions DR1, DR2, and DR3.

Referring to FIGS. 3 to 8, the pixel PXL may include a first sub-pixel SPXL1, a second sub-pixel SPXL2, and a third sub-pixel SPXL3.

In an embodiment, the first sub-pixel SPXL1 may be a red pixel, the second sub-pixel SPXL2 may be a green pixel, and the third sub-pixel SPXL3 may be a blue pixel. However, the disclosure is not limited thereto. In some embodiments, the second sub-pixel SPXL2 may be a red pixel, the first sub-pixel SPXL1 may be a green pixel, and the third sub-pixel SPXL3 may be a blue pixel. In other embodiments, the third sub-pixel SPXL3 may be a red pixel, the first sub-pixel SPXL1 may be a green pixel, and the second sub-pixel SPXL2 may be a blue pixel.

The first sub-pixel SPXL1 may include a first sub-pixel circuit SPXC1 and a first sub-light emitting unit EMU1, the second sub-pixel SPXL2 may include a second sub-pixel circuit SPXC2 and a second sub-light emitting unit EMU2, and the third sub-pixel SPXL3 may include a third sub-pixel circuit SPXC3 and a third sub-light emitting unit EMU3. The first sub-pixel circuit SPXC1, the second sub-pixel circuit SPXC2, and the third sub-pixel circuit SPXC3 may constitute a pixel circuit PXC of the pixel PXL. The first sub-light emitting unit EMU1, the second sub-light emitting unit EMU2, and the third sub-light emitting unit EMU3 may constitute a light emitting unit of the pixel PXL. Each of the first sub-pixel circuit SPXC1, the second sub-pixel circuit SPXC2, and the third sub-pixel circuit SPXC3 may be the sub-pixel circuit SPXC described with reference to FIG. 4. Each of the first sub-light emitting unit EMU1, the second sub-light emitting unit EMU2, and the third sub-light emitting unit EMU3 may be the light emitting unit EMU described with reference to FIG. 4.

In a pixel area PXA in which the pixel PXL is provided, an area in which the first sub-pixel SPXL1 is provided may be a first sub-pixel area SPXA1, an area in which the second sub-pixel SPXL2 is provided may be a second sub-pixel area SPXA2, and an area in which the third sub-pixel SPXL3 is provided may be a third sub-pixel area SPXA3.

The pixel area PXA may include a first sub-pixel circuit area SPXCA1, a second sub-pixel circuit area SPXCA2, and a third sub-pixel circuit area SPXCA3. In an example, the pixel area PXA may be partitioned in an order of the first sub-pixel circuit area SPXCA1, the third sub-pixel circuit area SPXCA3, and the second sub-pixel circuit area SPXCA2 along the second direction DR2.

The first sub-pixel circuit area SPXCA1 may be an area in which the first sub-pixel circuit SPXC1 is provided, the second sub-pixel circuit area SPXCA2 may be an area in which the second sub-pixel circuit SPXC2 is provided, and the third sub-pixel circuit area SPXCA3 may be an area in which the third sub-pixel circuit SPXC3 is provided. The first sub-pixel circuit area SPXCA1, the second sub-pixel circuit area SPXCA2, and the third sub-pixel circuit area SPXCA3 may constitute a pixel circuit area PXCA of the pixel PXL.

The pixel PXL may include the substrate SUB, a pixel circuit layer PCL, and the display element layer DPL.

The substrate SUB may include a transparent insulating material to enable light to be transmitted therethrough. The substrate SUB may be a rigid substrate or a flexible substrate.

The rigid substrate may be, for example, at least one of a glass substrate, a quartz substrate, a glass ceramic substrate, and a crystalline glass substrate.

The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The material applied to the substrate SUB may have resistance (or heat resistance) against high processing temperature in a process of manufacturing the display device DD.

Insulating layers and conductive layers may be disposed on the substrate SUB. The insulating layers may include, for example, a buffer layer BFL, a gate insulating layer GI, an interlayer insulating layer ILD, a protective layer PSV, and first, second, and third insulating layers INS1, INS2, and INS3. The conductive layers may be provided and/or formed between the above-described insulating layers. The conductive layers may include, for example, a first conductive layer provided on the substrate SUB, a second conductive layer provided on the gate insulating layer GI, a third conductive layer provided on the interlayer insulating layer ILD, a fourth conductive layer provided on the passivation layer PSV, and a fifth conductive layer provided on the second insulating layer INS2. However, the insulating layers and the conductive layers, which may be provided on the substrate SUB, are not limited to the above-described embodiment. In some embodiments, another insulating layer and another conductive layer in addition to the insulating layers and the conductive layers may be provided on the substrate SUB.

A signal line electrically connected to the pixel PXL may be located on the substrate SUB. The signal line may include multiple signal lines which transfer a signal (or voltage) to the pixel PXL. The signal lines may include a first scan line S1, data lines D1, D2, and D3, a power line PL, an initialization power line IPL, and a second scan line S2.

The first scan line S1 may include a first sub-scan line S1_1 and a second sub-scan line S1_2, which may be spaced apart from each other.

The first sub-scan line S1_1 may correspond to the third conductive layer provided on the interlayer insulating layer ILD. The third conductive layer may be formed in a single layer including at least one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layer structure including molybdenum (Mo), titanium (Ti), copper (Cu), aluminum (Al) and/or silver (Ag), which is a low-resistance material so as to decrease wiring resistance.

A scan signal may be applied to the first sub-scan line S1_1. The first sub-scan line S1_1 may be the scan line Si described with reference to FIG. 4. In the pixel PXL, the first sub-scan line S1_1 may be connected to a first connection line CNL1 through a corresponding contact hole CH. In an example, the first sub-scan line S1_1 may be electrically and/or physically connected to the first connection line CNL1 through a contact hole CH penetrating the interlayer insulating layer ILD in the corresponding pixel PXL.

The first connection line CNL1 may correspond to the second conductive layer provided and/or formed on the gate insulating layer GI. The second conductive layer may include the same material as the third conductive layer or include at least one material selected from the materials disclosed as the material constituting the third conductive layer. The first connection line CNL1 may be integrally provided with a second gate electrode GE2 of a second thin film transistor T2 of each of the first, second, and third sub-pixel circuits SPXC1, SPXC2, and SPXC3 of the corresponding pixel PXL. In an example, a portion of the first connection line CNL1 may be the second gate electrode GE2 of each of the first, second, and third sub-pixel circuits SPXC1, SPXC2, and SPXC3. Accordingly, the first sub-scan line S1_1 may be connected to the second gate electrode GE2 of each of the first, second, and third sub-pixel circuits SPXC1, SPXC2, and SPXC3 of the corresponding pixel PXL.

A sensing control signal may be applied to the second sub-scan line S1_2. The second sub-scan line S1_2 may be the control line CL1 described with reference to FIG. 4. The second sub-scan line S1_2 may correspond to the third conductive layer disposed on the interlayer insulating layer ILD. In the pixel PXL, the second sub-scan line S1_2 may be connected to a second connection line CNL2 through a corresponding contact hole CH. In an example, the second sub-scan line S1_2 may be electrically and/or physically connected to the second connection line CNL2 through a contact hole CH penetrating the interlayer insulating layer ILD in the corresponding pixel PXL.

The second connection line CNL2 may correspond to the second conductive layer provided (or disposed) and/or formed on the gate insulating layer GI. In an embodiment, the second connection line CNL2 may be provided in the same layer as the first connection line CNL1. The second connection line CNL2 may be integrally provided with a third gate electrode GE3 of a third thin film transistor T3 of each of the first, second, and third sub-pixel circuits SPXC1, SPXC2, and SPXC3 of the corresponding pixel PXL. In an example, a portion of the second connection line CNL2 may be the third gate electrode GE3 of each of the first, second, and third sub-pixel circuits SPXC1, SPXC2, and SPXC3. Accordingly, the second sub-scan line S1_2 may be connected to the third gate electrode GE3 of each of the first, second, and third sub-pixel circuits SPXC1, SPXC2, and SPXC3.

The first connection line CNL1 and the second connection line CNL2, which are described above, may be common components commonly provided to the first, second, and third sub-pixel circuits SPXC1, SPXC2, and SPXC3.

In an embodiment, the first sub-scan line S1_1 may be adjacent to a 1bth power line PL1*b*, and may be spaced apart from the 1bth power line PL1*b*. The second sub-scan line S1_2 may be adjacent to a 2bth power line PL2*b*, and may be spaced apart from the 2bth power line PL2*b*.

The interlayer insulating layer ILD may be an insulating layer including an inorganic material. In an example, an interlayer insulating layer ILD may include at least one of silicon nitride ($SiN_x$), silicon oxide ($SiO_x$), silicon oxynitride ($SiO_xN_y$), and metal oxide such as aluminum oxide ($AlO_x$). However, the material of the interlayer insulating layer ILD is not limited to the above-described embodiments. In some embodiments, the interlayer insulating layer ILD may be configured as an insulating layer including an organic material. The interlayer insulating layer ILD may be provided as a single layer, but be provided as a multi-layer including at least two layers.

The gate insulating layer GI may be located on the bottom of the interlayer insulating layer ILD. The gate insulating layer GI may include the same material as the interlayer insulating layer ILD or include at least one selected from the materials disclosed as the material constituting the interlayer insulating layer ILD. In an example, the gate insulating layer GI may be an insulating layer including an inorganic material.

The data lines D1, D2, and D3 may be disposed to be spaced apart from each other along the first direction DR1, and include a first data line D1, a second data line D2, and a third data line D3, which extend in the second direction DR2 different from, e.g., intersecting the first direction DR1. A corresponding data signal may be applied to each of the first, second, and third data lines D1, D2, and D3. Each of the first, second, and third data lines D1, D2, and D3 may be the data line Dj described with reference to FIG. 4.

The first data line D1 may be electrically connected to a second thin film transistor T2 of the first sub-pixel circuit SPXC1, the second data line D2 may be electrically connected to a second thin film transistor T2 of the second sub-pixel circuit SPXC2, and the third data line D3 may be electrically connected to a second thin film transistor T2 of the third sub-pixel circuit SPXC3. The first, second, and third data lines D1, D2, and D3 may correspond to the first conductive layer provided on the substrate SUB. The first conductive layer may include the same material as the third conductive layer or include at least one selected from the materials disclosed as the material constituting the third conductive layer.

The power line PL may include a first power line PL1 and a second power line PL2.

The voltage of the first driving power source VDD may be applied to the first power line PL1. The first power line PL1 may be the first power line PL1 described with reference to FIG. 4. The first power line PL1 may include the 1ath power line PL1*a* and the 1bth power line PL1*b*.

The 1ath power line PL1*a* may extend along the second direction DR2. In an embodiment, the 1ath power line PL1*a* may include a first layer FL and a second layer SL. The first layer FL may correspond to the first conductive layer provided (or disposed) and/or formed on the substrate SUB. The second layer SL may correspond to the third conductive layer provided (or disposed) and/or formed on the interlayer insulating layer ILD. The first layer FL may be provided in the same layer as the first, second, and third data lines D1, D2, and D3, and the second layer SL may be provided in the same layer as the first scan line Si. The second layer SL may be electrically connected to the first layer FL through at least one contact hole CH. In an example, the second layer SL may be electrically and/or physically connected to the first layer FL through at least one contact hole CH sequentially penetrating the buffer layer BFL, the gate insulating layer GI, and the interlayer insulating layer ILD.

The 1bth power line PL1*b* may extend along the first direction DR1. The 1bth power line PL1*b* may correspond to the third conductive layer provided (or disposed) and/or formed on the interlayer insulating layer ILD. The 1bth power line PL1*b* may be provided in the same layer as the first sub-scan line S1_1 and the second layer SL of the 1ath power line PL1*a*, and be disposed to be spaced apart from the first sub-scan line S1_1 in a plan view. The 1bth power line PL1*b* may be connected to the 1ath power line PL1*a* through a corresponding contact hole CH. In an example, the 1bth power line PL1*b* may be electrically and/or physically connected to the first layer FL of the 1ath power line PL1*a* through a contact hole CH sequentially penetrating the buffer layer BFL, the gate insulating layer GI, and the interlayer insulating layer ILD.

The first power line PL1 including the 1ath power line PL1*a* and the 1bth power line PL1*b*, which may be connected to each other, may have a mesh structure. In an embodiment, the 1ath power line PL1*a* may be implemented in a double-layer structure including the first layer FL and the second layer SL, to decrease wiring resistance, thereby reducing signal distortion. However, the disclosure is not limited thereto. In some embodiments, the 1ath power line PL1*a* may be implemented in a single-layer structure or a multi-layer structure including at least three layers.

The voltage of the second driving power source VSS may be applied to the second power line PL2. The second power line PL2 may be the second power line PL2 described with reference to FIG. 4. The second power line PL2 may include a 2ath power line PL2*a* and the 2bth power line PL2*b*.

The 2ath power line PL2*a* may extend in the second direction DR2. The 2ath power line PL2*a* may be implemented in a single-layer structure including a first layer FL. The first layer FL may correspond to the first conductive layer provided (or disposed) and/or formed on the substrate SUB. The first layer FL may be provided in the same layer as the first, second, and third data lines D1, D2, and D3 and the first layer FL of the 1ath power line PL1*a*. The first layer FL may be disposed to be spaced apart from the first, second, and third data lines D1, D2, and D3 and the 1ath power line PL1*a*, in a plan view.

Although an embodiment in which the 2ath power line PL2*a* is implemented in a single-layer structure including only the first layer FL has been described, the disclosure is not limited thereto. In some embodiments, the 2ath power line PL2*a* may be implemented in a double-layer structure, similarly to the 1ath power line PL1*a*. Also, the 2ath power line PL2*a* may be implemented in a multi-layer structure including three or more layers.

The 2ath power line PL2*a* and the 2bth power line PL2*b* may be electrically connected to each other through a corresponding contact hole CH. In an example, the 2bth power line PL2*b* may be electrically and/or physically connected to the 2ath power line PL2*a* through a contact hole sequentially penetrating the buffer layer BFL, the gate insulating layer GI, and the interlayer insulating layer ILD. The second power line PL2 including the 1ath power line PL2*a* and the 2b power line PL2*b*, which may be connected to each other, may have a mesh structure.

The second scan line S2 may include a third sub-scan line S2_1 and a fourth sub-scan line S2_2, which may be spaced apart from each other.

The second scan line S2 may extend in the second direction DR2 intersecting the first direction DR1 as an extending direction of the first scan line S1. In each pixel PXL, the second scan line S2 may intersect the first scan line S1, so that a portion of the second scan line S2 overlaps the first scan line S1. The second scan line S2 may be electrically connected to the driver DIC (see FIG. 3) located at one side of the non-display area NDA of the substrate SUB, to be supplied with a scan signal and a sensing control signal from the driver DIC. In an example, the third sub-scan line S2_1 may be supplied with the scan signal from the driver DIC, and the fourth sub-scan line S2_2 may be supplied with the sensing control signal from the driver DIC.

In an embodiment, each of the third sub-scan line S2_1 and the fourth sub-scan line S2_2 may be implemented in a triple-layer structure including a first conductive line CL1, a second conductive line CL2, and a third conductive line CL3. The first conductive line CL1 may correspond to the first conductive layer provided (or disposed) and/or formed on the substrate SUB, the second conductive line CL2 may correspond to the second conductive layer provided (or disposed) and/or formed on the gate insulating layer GI, and the third conductive line CL3 may correspond to the third conductive layer provided (or disposed) and/or formed on the interlayer insulating layer ILD. The third conductive line CL3 may be electrically and/or physically connected to the first conductive line CL1 through a contact hole sequentially penetrating the buffer layer BFL, the gate insulating layer GI, and the interlayer insulating layer ILD. Also, the third conductive line CL3 may be electrically connected to the second conductive line CL2 through a contact hole penetrating the interlayer insulating layer ILD. Accordingly, the first conductive line CL1 and the second conductive line CL2 may be connected to each other through the third conductive line CL3.

In the above-described embodiment, it has been described that each of the third sub-scan line S2_1 and the fourth sub-scan line S2_2 is implemented in the triple-layer structure including the first conductive line CL1, the second conductive line CL2, and the third conductive line CL3. However, the disclosure is not limited thereto. In some embodiments, each of the third sub-scan line S2_1 and the fourth sub-scan line S2_2 may be implemented in a single-layer structure, a double-layer structure, or a multi-layer structure including three or more layers.

One scan line selected from the third sub-scan line S2_1 and the fourth sub-scan line S2_2 may be connected to the first sub-scan line S1_1 through a corresponding contact hole CH, and the other scan line selected from the third sub-scan line S2_1 and the fourth sub-scan line S2_2 may be connected to the second sub-scan line S1_2 through a corresponding contact hole CH. In an example, the third sub-scan line S2_1 may be connected to the first sub-scan line S1_1 through a contact hole CH sequentially penetrating the buffer layer BFL, the gate insulating layer GI, and the interlayer insulating layer ILD. The fourth sub-scan line S2_2 may be connected to the second sub-scan line S1_2 through a contact hole CH sequentially penetrating the buffer layer BFL, the gate insulating layer GI, and the interlayer insulating layer ILD.

The initialization power line IPL may extend in the second direction DR2, and be disposed between the lath power line PL1*a* and the first data line D1. The initialization power line IPL may be the sensing line SENj described with reference to FIG. 4. The voltage of the initialization power source may be applied to the initialization power line IPL. In an embodiment, the initialization power line IPL may correspond to the first conductive layer provided and/or formed on the substrate SUB. The initialization power line IPL may be provided and/or formed in the same layer as the first, second, and third data lines D1, D2, and D3.

The initialization power line IPL may be electrically connected to a third thin film transistor T3 of the first sub-pixel circuit SPXC1 through a second conductive pattern CP2, and be electrically connected to a third thin film transistor T3 of each of the second and third sub-pixel circuits SPXC2 and SPXC3 through a fifth conductive pattern CP5.

The second conductive pattern CP2 may correspond to the third conductive layer provided (or disposed) and/or formed on the interlayer insulating layer ILD. An end of the second conductive pattern CP2 may be electrically and/or physically connected to the initialization power line IPL through a contact hole CH sequentially penetrating the buffer layer BFL, the gate insulating layer GI, and the interlayer insulating layer ILD. Another end of the second conductive pattern CP2 may be electrically connected to a third drain region DE3 of the third thin film transistor T3 of the first sub-pixel circuit SPXC1 through a contact hole CH sequentially penetrating the gate insulating layer GI and the interlayer insulating layer ILD.

The fifth conductive pattern CP5 may correspond to the third conductive layer provided (or disposed) and/or formed on the interlayer insulating layer ILD. An end of the fifth conductive pattern CP5 may be electrically and/or physically connected to the initialization power line IPL through a contact hole CH sequentially penetrating the buffer layer BFL, the gate insulating layer GI, and the interlayer insulating layer ILD. Another end of the fifth conductive pattern CP5 may be electrically connected to a third drain region DE3 of the third thin film transistor T3 of each of the second and third sub-pixel circuits SPXC2 and SPXC3 through a contact hole sequentially penetrating the gate insulating layer GI and the interlayer insulating layer ILD.

The first power line PL1, the second power line PL2, the initialization power line IPL, the first and second connection lines CNL1 and CNL2, the first scan line S1, and the second scan line S2, which are described above, may be common components commonly provided to the first, second, and third sub-pixel circuits SPXC1, SPXC2, and SPXC3.

Each of the first, second, and third sub-pixels SPXL1, SPXL2, and SPXL3 may include a pixel circuit layer PCL (or circuit element layer) including a corresponding sub-pixel circuit. In an example, a pixel circuit layer PCL of the first sub-pixel SPXL1 may include the buffer layer BFL, the first sub-pixel circuit SPXC1, and the protective layer PSV (or passivation layer). A pixel circuit layer PCL of the second sub-pixel SPXL2 may include the buffer layer BFL, the second sub-pixel circuit SPXC2, and the protective layer PSV. A pixel circuit layer PCL of the third sub-pixel SPXL3 may include the buffer layer BFL, the third sub-pixel circuit SPXC3, and the protective layer PSV.

The buffer layer BFL may be located over the first conductive layer, and prevent an impurity or the like from being diffused into each of the first, second, and third sub-pixel circuits SPXC1, SPXC2, and SPXC3. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be provided as a single layer, or may be provided as a multi-layer including at least two layers. In case that the buffer layer BFL is provided as the multi-layer, the layers may be formed of the same material or be formed of different materials. The buffer layer BFL may be omitted according to a material of the substrate SUB, a process condition, and the like.

Each of the first, second, and third sub-pixel circuits SPXC1, SPXC2, and SPXC3 may include a first thin film transistor T1, a second thin film transistor T2, a third thin film transistor T3, and a storage capacitor. In an example, the first sub-pixel circuit SPXC1 may include first, second, and third thin film transistors T1, T2, and T3 and a first storage capacitor Cst1. The second sub-pixel circuit SPXC2 may include first, second, and third thin film transistors T1, T2, and T3 and a second storage capacitor Cst2. The third sub-pixel circuit SPXC3 may include first, second, and third thin film transistors T1, T2, and T3 and a third storage capacitor Cst3. The first thin film transistor T1 of each of the first, second, and third sub-pixel circuits SPXC1, SPXC2, and SPXC3 may be the first thin film transistor T1 described with reference to FIG. 4, the second thin film transistor T2 of each of the first, second, and third sub-pixel circuits SPXC1, SPXC2, and SPXC3 may be the second thin film transistor T2 described with reference to FIG. 4, and the third thin film transistor T3 of each of the first, second, and third sub-pixel circuits SPXC1, SPXC2, and SPXC3 may be the third thin film transistor T3 described with reference to FIG. 4.

The first sub-pixel circuit SPXC1, the second sub-pixel circuit SPXC2, and the third sub-pixel circuit SPXC3 may have structures substantially identical or similar to one another. Hereinafter, common components of the first, second, and third sub-pixel circuits SPXC1, SPXC2, and SPXC3 will be described based on the first sub-pixel circuit SPXC1, and overlapping descriptions will not be repeated.

The first thin film transistor T1 may include a first gate electrode GE1, a first active pattern ACT1, a first source region SE1, and a first drain region DE1.

The first gate electrode GE1 may be connected to a second source region SE2 of the second thin film transistor T2 through a first conductive pattern CP1. The first gate electrode GE1 may correspond to the second conductive layer provided (or disposed) and/or formed on the gate insulating layer GI.

The first conductive pattern CP1 may correspond to the third conductive layer. An end of the first conductive pattern CP1 may be electrically and/or physically connected to the first gate electrode GE1 through a contact hole penetrating the interlayer insulating layer ILD. Another end of the first conductive pattern CP1 may be electrically and/or physically connected to the second source region SE2 of the second thin film transistor T2 through a contact hole CH sequentially penetrating the gate insulating layer GI and the interlayer insulating layer ILD.

Each of the first active pattern ACT1, the first source region SE1, and the first drain region DE1 may be a semiconductor pattern made of poly silicon, amorphous silicon, an oxide semiconductor, and/or the like. Each of the first active pattern ACT1, the first source region SE1, and the first drain region DE1 may be formed as a semiconductor layer undoped or doped with an impurity. In an example, each of the first source region SE1 and the first drain region DE1 may be configured as a semiconductor layer doped with the impurity, and the first active pattern ACT1 may be configured as a semiconductor layer undoped with the impurity. In an example, an n-type impurity may be used as the impurity, but the disclosure is not limited thereto.

The first active pattern ACT1, the first source region SE1, and the first drain region DE1 may be provided and/or formed on the buffer layer BFL.

The first active pattern ACT1 may be a region overlapping the first gate electrode GE1, and may be a channel region of the first thin film transistor T1. In case that the first active pattern ACT1 is formed long, the channel region of the first thin film transistor T1 may be formed long. The driving range of a voltage (or signal) applied to the first thin film transistor T1 may be widened. Accordingly, the grayscale of light (or beam) emitted from light emitting elements LD can be finely controlled.

The first source region SE1 may be connected to (or in contact with) an end of the first active pattern ACT1. Also, the first source region SE1 may be electrically connected to a first bottom metal layer BML1 through a contact hole CH penetrating the buffer layer BFL. The first source region SE1 may be the second terminal of the first thin film transistor T1 described with reference to FIG. 4.

The first bottom metal layer BML1 may correspond to the first conductive layer provided and/or formed on the substrate SUB. The first bottom metal layer BML1 may be provided and/or formed in the same layer as the first, second, and third data lines D1, D2, and D3, the lath and lath power lines PL1*a* and PL2*a*, the first conductive line CL1 of each of the third and fourth sub-scan lines S2_1 and S2_2, and the initialization power line IPL. The first bottom metal layer BML1 may be electrically and/or physically connected to the first source region SE1 through a corresponding contact hole CH. In case that the first bottom metal layer BML1 is connected to the first thin film transistor T1, a swing width margin of the second driving power source VSS can be further secured. The driving range of a voltage supplied to the first gate electrode GE1 of the first thin film transistor T1 can be widened.

The first drain area DE1 may be connected to (or in contact with) another end of the first active pattern ACT1. Also, the first drain region DE1 may be electrically and/or physically connected to the first layer FL of the lath power line PL1*a* through a contact hole penetrating the buffer layer BFL. The first drain region DE1 may be the first terminal of the first thin film transistor T1 described with reference to FIG. 4.

The second thin film transistor T2 may include a second gate electrode GE2, a second active pattern ACT2, the second source region SE2, and a second drain region DE2.

The second gate electrode GE2 may be integrally provided with the first connection line CNL1. The second gate electrode GE2 may be an area of the first connection line CNL1. As described above, the first connection line CNL1 may be connected to the first sub-scan line S1_1 through a corresponding contact hole CH, and therefore, a signal (e.g., a scan signal) applied to the first sub-scan line S1_1 may be supplied to the second gate electrode GE2.

Each of the second active pattern ACT2, the second source region SE2, and the second drain region DE2 may be a semiconductor pattern made of poly silicon, amorphous silicon, an oxide semiconductor, and/or the like. Each of the second active pattern ACT2, the second source region SE2, and the second drain region DE2 may be formed as a semiconductor layer undoped or doped with an impurity. In an example, each of the second source region SE2 and the second drain region DE2 may be configured as a semiconductor layer doped with the impurity, and the second active pattern ACT2 may be configured as a semiconductor layer undoped with the impurity. In an example, an n-type impurity may be used as the impurity.

The second active pattern ACT2, the second source region SE2, and the second drain region DE2 may be provided and/or formed on the buffer layer BFL.

The second active pattern ACT2 may be a region overlapping the second gate electrode GE2, and may be a channel region of the second thin film transistor T2.

The second source region SE2 may be connected to (or in contact with) an end of the second active pattern ACT2. Also, the second source region SE2 may be connected to the first gate electrode GE1 through the first conductive pattern CP1. The second source region SE2 may be the second terminal of the second thin film transistor T2 described with reference to FIG. 4.

The second drain region DE2 may be connected to (or in contact with) another end of the second active pattern ACT2. Also, the drain region DE2 may be connected to the first data line D1 through a third conductive pattern CP3. The second drain region DE2 may be the first terminal of the second thin film transistor T2 described with reference to FIG. 4.

The third conductive pattern CP3 may correspond to the third conductive layer provided (or disposed) and/or formed on the interlayer insulating layer ILD. An end of the third conductive pattern CP3 may be electrically and/or physically connected to the first data line D1 through a contact hole CH sequentially penetrating the buffer layer BFL, the gate insulating layer GI, and the interlayer insulating layer ILD. Another end of the third conductive pattern CP3 may be connected to the second drain region DE2 through a contact hole CH sequentially penetrating the gate insulating layer GI and the interlayer insulating layer ILD. The second drain region DE2 and the first data line D1 may be electrically connected to each other through the third conductive pattern CP3.

The third thin film transistor T3 may include a third gate electrode GE3, a third active pattern ACT3, a third source region SE3, and the third drain region DE3.

The third gate electrode GE3 may be integrally provided with the second connection line CL2. As described above, the second connection line CNL2 may be connected to the second sub-scan line S1_2 through a corresponding contact hole CH, and therefore, a signal (e.g., a sensing control signal) applied to the second sub-scan line S1_2 may be supplied to the third gate electrode GE3.

Each of the third active pattern ACT3, the third source region SE3, and the third drain region DE3 may be a semiconductor pattern made of poly silicon, amorphous silicon, an oxide semiconductor, and/or the like. Each of the third active pattern ACT3, the third source region SE3, and the third drain region DE3 may be formed as a semiconductor layer undoped or doped with an impurity. In an example, each of the third source region SE3 and the third drain region DE3 may be configured as a semiconductor layer doped with the impurity, and the third active pattern ACT3 may be configured as a semiconductor layer undoped with the impurity. In an example, an n-type impurity may be used as the impurity.

The third active pattern ACT3, the third source region SE3, and the third drain region DE3 may be provided and/or formed on the buffer layer BFL.

The third active pattern ACT3 may be a region overlapping the third gate electrode GE3, and may be a channel region of the third thin film transistor T3.

The third source region SE3 may be connected to (or in contact with) an end of the third active pattern ACT3. Also, the third source region SE3 may be electrically and/or physically connected to the first bottom metal layer BML1 through a contact hole penetrating the buffer layer BFL. The third source region SE3 may be the second terminal of the third thin film transistor T3 described with reference to FIG. 4.

The third drain region DE3 may be connected to (or in contact with) another end of the third active pattern ACT3. Also, the third drain region DE3 may be electrically connected to the initialization power line IPL through the second conductive pattern CP2. The third drain region DE3 may be the first terminal of the third thin film transistor T3 described with reference to FIG. 4.

The first storage capacitor Cst1 may include a first lower electrode LE1 and a first upper electrode UE1. The first storage capacitor Cst1 may be the storage capacitor Cst described with reference to FIG. 4.

The first lower electrode LE1 may be integrally provided with the first gate electrode GE1. The first lower electrode LE1 may be an area of the first gate electrode GE1.

The first upper electrode UE1 may be disposed to overlap the first lower electrode LE1 in a plan view, and have a size (or area) greater than a size (or area) of the first lower electrode LE1. However, the disclosure is not limited thereto. The first upper electrode UE1 may overlap each of the first source region SE1 and the third source region SE3 in a plan view. The first upper electrode UE1 may correspond to the third conductive layer provided (or disposed) and/or formed on the interlayer insulating layer ILD.

The first upper electrode UE1 may be electrically and/or physically connected to the first bottom metal layer BML1 through a contact hole CH sequentially penetrating the buffer layer BFL, the gate insulating layer GI, and the interlayer insulating layer ILD. As described above, the first source region SE1 and the third source region SE3 may be electrically connected to the first bottom metal layer BML1, and therefore, the first upper electrode UE1 may be electrically and/or physically connected to the first and third source regions SE1 and SE3 through the first bottom metal layer BML1.

In plan view, a second bottom metal layer BML2, a seventh conductive pattern CP7, an eighth conductive pattern CP8, a second lower electrode LE2, and a second upper electrode UE2 of the second sub-pixel circuit SPXC2 may be respectively substantially identical to the first bottom metal layer BML1, the first conductive pattern CP1, the third conductive pattern CP3, the first lower electrode LE1, and the first upper electrode UE1 of the first sub-pixel circuit SPXC1 or respectively perform the same functions as the first bottom metal layer BML1, the first conductive pattern CP1, the third conductive pattern CP3, the first lower electrode LE1, and the first upper electrode UE1 of the first sub-pixel circuit SPXC1, except arrangement positions thereof.

Similarly, in plan view, a third bottom metal layer BML3, a fourth conductive pattern CP4, a sixth conductive pattern CP6, a third lower electrode LE3, and a third upper electrode UE3 of the third sub-pixel circuit SPXC3 may be respectively substantially identical to the first bottom metal layer BML1, the first conductive pattern CP1, the third conductive pattern CP3, the first lower electrode LE1, and the first upper electrode UE1 of the first sub-pixel circuit SPXC1 or respectively perform the same functions as the first bottom metal layer BML1, the first conductive pattern CP1, the third conductive pattern CP3, the first lower electrode LE1, and the first upper electrode UE1 of the first sub-pixel circuit SPXC1, except arrangement positions thereof.

The protective layer PSV may be provided (or disposed) and/or formed over the first sub-pixel circuit SPXC1, the second sub-pixel circuit SPXC2, and the third sub-pixel circuit SPXC3, which are described above.

The protective layer PSV may be provided in a form including an organic layer, an inorganic layer, or the organic layer disposed on the inorganic layer. The inorganic layer may include, for example, at least one of silicon nitride ($SiN_x$), silicon oxide ($SiO_x$), silicon oxynitride ($SiO_xN_y$), and metal oxide such as aluminum oxide ($AlO_x$). The organic layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin.

The protective layer PSV may include a first via hole VIH1 and a second via hole VIH2.

The first via hole VIH1 may expose each of an area of the 2bth power line PL2*b*, another area of the 2bth power line PL2*b*, and still another area of the 2bth power line PL2*b*. The second via hole VIH2 may expose an area of the first upper electrode UE1, an area of the second upper electrode UE2, and an area (e.g., a protrusion pattern PRP) of the third upper electrode UE3. In an embodiment, three first via holes VIH1 may be provided in the pixel area PXA, and two second via holes VIH2 may be provided in the pixel area PXA.

The pixel area PXA may include a first emission area EMA1, a second emission area EMA2, and a third emission area EMA3. In an example, the pixel area PXA may include the first emission area EMA1, the second emission area EMA2, and the third emission area EMA3, which may be partitioned along the first direction DR1.

The first emission area EMA1 may be an area in which light is emitted from light emitting elements LD driven by the first sub-pixel circuit SPXC1. The light emitting elements LD may correspond to one component of the first sub-light emitting unit EMU1. In an embodiment, the first emission area EMA1 may be an emission area of the first sub-pixel SPXL1.

The second emission area EMA2 may be an area in which light is emitted from light emitting elements LD driven by the second sub-pixel circuit SPXC2. The light emitting elements LD may correspond to one component of the second sub-light emitting unit EMU2. In an embodiment, the second emission area EMA2 may be an emission area of the second sub-pixel SPXL2.

The third emission area EMA3 may be an area in which light is emitted from light emitting elements LD driven by the third sub-pixel circuit SPXC3. The light emitting elements LD may correspond to one component of the third sub-light emitting unit EMU3. In an embodiment, the third emission area EMA3 may be an emission area of the third sub-pixel SPXL3.

The first emission area EMA1, the second emission area EMA2, and the third emission area EMA3, which are described above, may constitute an emission area EMA of the pixel PXL.

The pixel area PXA in which the pixel PXL may be provided may include a non-emission area NEMA adjacent to (or surrounding the periphery of the first emission area EMA1) the first emission area EMA1, a non-emission area NEMA adjacent to (or surrounding the periphery of the second emission area EMA2) the second emission area EMA2, and a non-emission area NEMA adjacent to (or surrounding the periphery of the third emission area EMA3) the third emission area EMA3.

As shown in FIGS. 6 to 8, each of the first sub-pixel SPXL1, the second sub-pixel SPXL2, and the third sub-pixel SPXL3 may include a display element layer DPL (or display layer) including light emitting elements LD. A display element layer DPL of the first sub-pixel SPXL1 may correspond to the first emission area EMA1, a display element layer DPL of the second sub-pixel SPXL2 may correspond to the second emission area EMA2, and a display element layer DPL of the third sub-pixel SPXL3 may correspond to the third emission area EMA3.

The display element layer DPL may be provided and/or formed on the protective layer PSV.

The display element layer DPL may include a bank BNK, first, second, third, and fourth electrodes EL1, EL2, EL3, and EL4 (alignment electrodes, or reflective electrodes), light emitting elements LD, first and second pixel electrode CNE1 and CNE2, an intermediate electrode CTE, and the first, second, and third insulating layers INS1, INS2, and INS3.

The bank BNK may be a structure which defines a pixel area PXA (or emission area EMA) of each of the pixel PXL (or the first, second, and third sub-pixels SPXL1, SPXL2, and SPXL3) and pixels PXL adjacent thereto, and may be, for example, a pixel defining layer. The bank BNK may be located in areas between the first, second, and third emission areas EMA1, EMA2, and EMA3 and at outer portions of the first, second, and third emission areas EMA1, EMA2, and EMA3.

The bank BNK may be a dam structure, which defines each emission area EMA to which light emitting elements LD are to be supplied, in a process of supplying the light emitting elements LD to the pixel PXL (or each sub-pixel). In an example, the first, second, and third emission areas EMA1, EMA2, and EMA3 may be partitioned by the bank BNK, so that a mixed liquor (e.g., an ink) including a desired amount and/or a desired kind of light emitting elements LD can be supplied (or input) to each of the first, second, and third emission areas EMA1, EMA2, and EMA3.

The bank BNK may include at least one light blocking material and/or at least one reflective material, to prevent a light leakage defect in which light (or beam) is leaked between each of the first, second, and third emission areas EMA1, EMA2, and EMA3 and sub-pixels adjacent thereto. In some embodiments, the bank BNK may include a transparent material. In an example, the transparent material may include polyamides resin, polyimides resin, etc., but the disclosure is not limited thereto. In another embodiment, a reflective material layer may be separately provided and/or formed on the bank BNK so as to further improve the efficiency of light emitted from the pixel PXL.

The bank BNK may include at least one opening area exposing components located thereunder in the pixel area PXA. In an example, the bank BNK may include a first opening area OP1 and a second opening area OP2, which expose the components located thereunder in the pixel area PXA. In an embodiment, the first, second, and third emission areas EMA1, EMA2, and EMA3 may be defined by the second opening area OP2 of the bank BNK. Each of the first, second, and third emission areas EMA1, EMA2, and EMA3 and the second opening area OP2 of the bank BNK may correspond to each other.

In the pixel area PXA, the first opening area OP1 of the bank BNK may be located to be spaced apart from the second opening area OP2 of the bank BNK1. The first opening area OP1 of the bank BNK may be located to be spaced apart from a top side and a bottom side of the second opening area OP2 of the bank BNK1.

As the bank BNK may be disposed in the non-emission areas NEMA between the first, second, and third emission areas EMA1, EMA2, and EMA3, an area to which the light emitting elements LD are supplied (or input) in the pixel area PXA may be determined. Accordingly, the light emitting elements LD may be supplied to only the area, so that material efficiency can be improved. The light emitting elements LD are prevented from being supplied to another area except the area, so that the number of light emitting elements LD which can be used as effective light sources in a corresponding emission area EMA can be increased. In an example, in a process of supplying light emitting elements LD to the pixel PXL (or each sub-pixel), the light emitting elements LD can be prevented from being supplied to an unnecessary area. Further, the light emitting elements LD can be efficiently supplied to each of the first, second, and third emission areas EMA1, EMA2, and EMA3. Accordingly, the light emitting elements LD can be prevented from being unnecessarily wasted, and manufacturing cost of the display device DD can be saved.

The bank BNK may be provided (or disposed) and/or formed on the first insulating layer INS1, but the disclosure is not limited thereto. In some embodiments, the bank BNK may be provided (or disposed) and/or formed on the protective layer PSV.

The first electrode EL1, the second electrode EL2, the third electrode EL3, and the fourth electrode EL4 may be sequentially arranged along the first direction DR1 on the protective layer PSV of each of the first, second, and third emission areas EMA1, EMA2, and EMA3 (or the first, second, and third sub-pixel areas SPXA1, SPXA2, and SPXA3). The first, second, third, and fourth electrodes EL1, EL2, EL3, and EL4 may correspond to the fourth conductive layer provided (or disposed) and/or formed on the protective layer PSV.

In each of the first, second, and third sub-pixel areas SPXA1, SPXA2, and SPXA3 (or the first, second, and third emission areas EMA1, EMA2, and EMA3), the first electrode EL1, the second electrode EL2, the third electrode EL3, and the fourth electrode EL4 may extend in the second direction DR2. An end portion of each of the first, second, third, and fourth electrodes EL1, EL2, EL3, and EL4 may be located in the first opening area OP1 of the bank BNK. The first, second, third, and fourth electrodes EL1, EL2, EL3, and EL4 may be separated from other electrodes (e.g., first, second, third, and fourth electrodes (not shown) provided in adjacent pixels PXL adjacent in the second direction DR2) in the first opening area OP1 after light emitting elements LD are supplied and aligned in each of the first, second, and third emission areas EMA1, EMA2, and EMA3 in a process of manufacturing the display device DD. Each first opening area OP1 of the bank BNK may be an electrode separation area provided to perform a separation process on the first electrode EL1, the second electrode EL2, the third electrode EL3, and the fourth electrode EL4.

In a corresponding sub-pixel area, each of first, second, third, and fourth electrodes EL1, EL2, EL3, and EL4 may be disposed to be spaced apart from an electrode adjacent along the first direction DR1. In an example, the first electrode EL1 may be disposed to be spaced apart from the second electrode EL2 in the first direction DR1, the second electrode EL2 may be disposed to be spaced apart from the third electrode EL3 in the first direction DR1, the third electrode EL3 may be disposed to be spaced apart from the fourth electrode EL4 in the first direction DR1, the fourth electrode EL4 may be disposed to be spaced apart from a first electrode (not shown) of an adjacent sub-pixel in the first direction DR1. A distance between the first electrode EL1 and the second electrode EL2, a distance between the second electrode EL2 and the third electrode EL3, a distance between the third electrode EL3 and the fourth electrode EL4, and a distance between the fourth electrode EL4 and the first electrode of the adjacent sub-pixel may be the same, but the disclosure is not limited thereto. In some embodiments, the distance between the first electrode EL1 and the second electrode EL2, the distance between the second electrode EL2 and the third electrode EL3, the distance between the third electrode EL3 and the fourth electrode EL4, and the distance between the fourth electrode EL4 and the first electrode of the adjacent sub-pixel may be different from one another. In some embodiments, the second electrode EL2 and the third electrode EL3 are not spaced apart from each other, but may be integrally formed. Similarly, the first electrode EL1 and the fourth electrode EL4 may not be spaced apart from each other, but may be integrally formed.

The first, second, third, and fourth electrodes EL1, EL2, EL3, and EL4 may be configured with a material having a constant reflexibility so as to allow light emitted from each of the light emitting elements LD to advance in an image display direction of the display device DD. In an example, the alignment electrodes may be made of a conductive material. The conductive material (or substance) may include an opaque metal advantageous in reflecting light emitted from the light emitting elements LD in the image display direction (e.g., a front direction) of the display device DD. In an example, the first, second, third, and fourth electrodes EL1, EL2, EL3, and EL4 may be configured with a conductive material having a constant reflexibility. The conductive material may include an opaque metal advantageous in reflecting light emitted from the light emitting elements LD in the image display direction of the display device DD (e.g., the third direction DR3). The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or alloys thereof. In some embodiments, the first, second, third, and fourth electrodes EL1, EL2, EL3, and EL4 may include a transparent conductive material. The transparent conductive material may include a conductive oxide such as indium tin oxide (ITO), indium zinc oxide (IZO), zinc oxide (ZnO), indium gallium zinc oxide (IGZO), and/or indium tin zinc oxide (ITZO), a conductive polymer such as poly(3,4-ethylenedioxythiophene) (PEDOT), and/or the like. In case that the first, second, third, and fourth electrodes EL1, EL2, EL3, and EL4 include a transparent conductive material, a separate conductive layer may be added, which is made of an opaque metal for reflecting light emitted from the light emitting elements LD in the image display direction of the display device DD. However, the material of the first, second, third, and fourth electrodes EL1, EL2, EL3, and EL4 is not limited to the above-described materials.

Also, each of the first, second, third, and fourth electrodes EL1, EL2, EL3, and EL4 may be provided and/or formed as a single layer, but the disclosure is not limited thereto. In some embodiments, each of the first, second, third, and fourth electrodes EL1, EL2, EL3, and EL4 may be provided and/or formed as a multi-layer in which at least two materials among metals, alloys, conductive oxide, and conductive polymers may be stacked on each other. Each of the first, second, third, and fourth electrodes EL1, EL2, EL3, and EL4 may be formed as a multi-layer including at least two layers so as to minimize distortion caused by a signal delay in case that a signal (or voltage) is transferred to both end portions of each of the light emitting elements LD. In an example, each of the first, second, third, and fourth electrodes EL1, EL2, EL3, and EL4 may be formed as a multi-layer in which indium tin oxide (ITO)/silver (Ag)/indium tin oxide (ITO) are sequentially stacked on each other.

In the corresponding sub-pixel area, the first electrode EL1 may be electrically connected to a partial configuration of a corresponding pixel circuit layer PCL through a first via hole VIH1. In an example, a first electrode EL1 of the first sub-pixel area SPXA1 may be electrically connected to a 2bth power line PL2*b* of the corresponding sub-pixel area through a first via hole VIH1 among the three first via holes VIH1 of the protective layer PSV. A first electrode EL1 of the second sub-pixel area SPXA2 may be electrically connected to a 2bth power line PL2*b* of the corresponding sub-pixel area through another first via hole VIH1 among the three first via holes VIH1 of the protective layer PSV. A first electrode EL1 of the third sub-pixel area SPXA3 may be electrically connected to a 2bth power line PL2*b* of the corresponding sub-pixel area through another first via hole VIH1 among the three first via holes VIH1 of the protective layer PSV. However, the disclosure is not limited thereto. Instead of the third electrode EL3, the second pixel electrode CNE2 which will be described later may be connected directly to the 2bth power line PL2*b* through the first via hole VIH1.

In the corresponding sub-pixel area, the third electrode EL3 may be electrically connected to a partial configuration of a corresponding pixel circuit layer PCL through a second via hole VIH2. In an example, a third electrode EL3 of the first sub-pixel area SPXA1 may be electrically connected to the first upper electrode UE1 through a second via hole VIH2 among the three second via holes VIH2 of the protective layer PSV. A third electrode EL3 of the second sub-pixel area SPXA2 may be electrically connected to the second upper electrode UE2 through another second via hole VIH2 among the three second via holes VIH2 of the protective layer PSV. A third electrode EL3 of the third sub-pixel area SPXA3 may be electrically connected to the protrusion pattern PRP through another second via hole VIH2 among the three second via holes VIH2 of the protective layer PSV. As described above, the protrusion pattern PRP may be an area of the third upper electrode UE3, and therefore, the third electrode EL3 of the third sub-pixel area SPXA3 may be electrically connected to the third upper electrode UE3. However, the disclosure is not limited thereto. The third electrode EL3 is not connected to the upper electrodes UE1 to UE3, but the second pixel electrode CNE2 which will be described later may be connected directly to the upper electrodes UE1 to UE3 through the second via holes VIH2.

Each of the first, second, third, and fourth electrodes EL1, EL2, EL3, and EL4 may receive an alignment signal transferred before light emitting elements LD are aligned in the emission area EMA, to be used as alignment electrodes (or alignment lines) for aligning the light emitting elements LD.

The first electrode EL1 may receive a first alignment signal transferred from the second power line PL2 in a process of aligning the light emitting elements LD, to be used as a first alignment electrode. The second electrode EL2 may receive a second alignment signal transferred from the first power line PL1 in the process of aligning the light emitting elements LD, to be used as a second alignment electrode. In the above-described process of aligning the light emitting elements LD, the third electrode EL3 may be connected to the second electrode EL2 to receive the second alignment signal, and the fourth electrode EL4 along with the first electrode EL1 may receive the first alignment signal. The above-described first and second alignment signals may be signals having a voltage difference and/or a phase difference to a degree to which the light emitting elements LD can be aligned between the first, second, third, and fourth electrodes EL1, EL2, EL3, and EL4. At least one of the first and second alignment signals may be an AC signal, but the disclosure is not limited thereto.

In some embodiments, a conductive capping layer may be disposed over the first, second, third, and fourth electrodes EL1, EL2, EL3, and EL4. The above-described capping layer may protect the first, second, third, and fourth electrodes EL1, EL2, EL3, and EL4 from a defect occurring in a process of manufacturing the display device DD, and further reinforce adhesion between the first, second, third, and fourth electrodes EL1, EL2, EL3, and EL4 and the protective layer PSV located on the bottom thereof. The capping layer may include a transparent conductive material such as indium zinc oxide (IZO).

In some embodiments, a support member (or pattern) may be disposed between each of the first, second, third, and fourth electrodes EL1, EL2, EL3, and EL4 and the protective layer PSV in each of the first, second, and third emission areas EMA1, EMA2, and EMA3. In an example, as shown in FIG. 8, a bank pattern BNKP may be located between each of the first, second, third, and fourth electrodes EL1, EL2, EL3, and EL4 and the protective layer PSV.

The bank pattern BNKP may be an insulating layer including an inorganic material or an organic material. In some embodiments, the bank pattern BNKP may include a single organic layer and/or a single inorganic layer, but the disclosure is not limited thereto. In some embodiments, the bank pattern BNKP may be provided in the form of a multi-layer in which at least one organic layer and at least one inorganic layer are stacked on each other. However, the material of the bank pattern BNKP is not limited to the above-described embodiment. In some embodiments, the bank pattern BNKP may include a conductive material.

The bank pattern BNKP may have a section with a trapezoidal shape of which width becomes narrower as approaching the top thereof along the third direction DR3 from a surface (e.g., an upper surface) of the protective layer PSV, but the disclosure is not limited thereto. In some embodiments, the bank pattern BNKP may include a curved surface having a section with a semi-elliptical shape, a semicircular shape (or hemispherical shape), or the like, of which width becomes narrower as approaching the top thereof along the third direction DR1 from the surface of the protective layer PSV. In a sectional view, the shape of the bank pattern BNKP are not limited to the above-described embodiments, and may be variously changed within a range in which the efficiency of light emitted from each of the light emitting elements LD can be improved.

The bank pattern BNKP may be provided (or disposed) and/or formed on the surface of the protective layer PSV, but the disclosure is not limited thereto. In some embodiments, the bank pattern BNKP may be integrally provided with the protective layer PSV to be configured as one area of the protective layer PSV. In an example, the bank pattern BNKP may be formed through the same process as the protective layer PSV, to be designed to have a height (or thickness) higher (or greater) than the upper surface of the protective layer PSV.

Each of the first, second, third, and fourth electrodes EL1, EL2, EL3, and EL4 may be provided and/or formed over the bank pattern BNKP. Accordingly, each of the first, second, third, and fourth electrodes EL1, EL2, EL3, and EL4 has a surface profile corresponding to the shape of the bank pattern BNKP disposed on the bottom thereof, so that light emitted from the light emitting elements LD can be reflected by each of the first, second, third, and fourth electrodes EL1, EL2, EL3, and EL4 to further advance in the image display direction of the display device DD. The bank pattern BNKP and each of the first, second, third, and fourth electrodes EL1, EL2, EL3, and EL4 may be used as a reflective member which guides light emitted from the light emitting elements LD in a desired direction, thereby improving the light efficiency of the display device DD. In case that each pixel PXL does not have the bank pattern BNKP, the first, second, third, and fourth electrodes EL1, EL2, EL3, and EL4 may be provided and/or formed on the surface (e.g., the upper surface) of the protective layer PSV.

After light emitting elements LD are aligned in each of the first, second, and third emission areas EMA1, EMA2, and EMA3, in order to independently (or individually) each of the first, second, and third pixels SPXL1, SPLX2, and SPXL3, a portion of each of first, second, third, and fourth electrodes EL1, EL2, EL3, and EL4 located between sub-pixels adjacent to each other in the second direction DR2 may be removed such that an end portion of each of the first, second, third, and fourth electrodes EL1, EL2, EL3, and EL4 is located in the first opening area OP1 of the bank BNK.

After light emitting elements LD may be aligned in each of the first, second, and third emission areas EMA1, EMA2, and EMA3, each of the first, second, third, and fourth electrodes EL1, EL2, EL3, and EL4 may be used as driving electrodes for driving the light emitting elements LD.

The first insulating layer INS1 may be provided (or disposed) and/or formed over the first, second, third, and fourth electrodes EL1, EL2, EL3, and EL4. For example, the first insulating layer INS1 may be formed to cover an area of each of the first, second, third, and fourth electrodes EL1, EL2, EL3, and EL4, and be partially opened to expose another area of each of the first, second, third, and fourth electrodes EL1, EL2, EL3, and EL4.

The first insulating layer INS1 may include an inorganic insulating layer made of an inorganic material or an organic insulating layer made of an organic material. The first insulating layer INS1 may be configured as an inorganic insulating layer advantageous in protecting the light emitting elements LD from the pixel circuit layer PCL. In an example, the first insulating layer INS1 may include at least one of silicon nitride ($SiN_x$), silicon oxide ($SiO_x$), silicon oxynitride ($SiO_xN_y$), and metal oxide such as aluminum oxide ($AlO_x$), the disclosure is not limited thereto. In some embodiments, the first insulating layer INS1 may be configured as an organic insulating layer advantageous in planarizing a support surface of the light emitting elements LD. The first insulating layer INS1 may be provided as a single layer or a multi-layer.

The first insulating layer INS1 may be provided (or disposed) and/or formed on the protective layer PSV to entirely cover the first, second, third, and fourth electrodes EL1, EL2, EL3, and EL4. After light emitting elements LD are supplied (or input) and aligned on the first insulating layer INS1, the first insulating layer INS1 may be partially opened to expose an area of each of the first and third electrodes EL1 and EL3. The first insulating layer INS1 may be patterned locally disposed on the bottom of the light emitting elements LD after the light emitting elements LD are supplied (or input) and aligned. The first insulating layer INS1 may cover other areas except the one area of each of the first and third electrodes EL1 and EL3. In some embodiments, the first insulating layer INS1 may be omitted. In other embodiments, the first insulating layer INS1 may be partially opened to expose an area of each of the first, second, third, and fourth electrodes EL1, EL2, EL3, and EL4.

The bank BNK may be provided and/or formed on the first insulating layer INS1.

In some embodiments, in each of the first, second, and third light emitting areas EMA1, EMA2, and EMA3 of the pixel PXL, the third electrode EL3 and the fourth electrode EL4 along with light emitting elements LD connected in parallel therebetween may constitute the second serial stage SET2 (see FIG. 4) (or first stage), and the first electrode EL1 and the second electrode EL2 along with light emitting elements LD connected in parallel therebetween may constitute the first serial stage SET1 (see FIG. 4) (or second stage).

In an embodiment, first and second serial stages SET1 and SET2 may be disposed in each of the first, second, and third emission areas EMA1, EMA2, and EMA3. The first and second serial stages SET1 and SET2 may constitute a sub-light emitting unit of each of the first, second, and third sub-pixels SPXL1, SPXL2, and SPXL3. In an example, first and second serial stages SET1 and SET2 disposed in the first emission area EMA1 may constitute the first sub-light emitting unit EMU1 of the first sub-pixel SPXL1, first and second serial stages SET1 and SET2 disposed in the second emission area EMA2 may constitute the second sub-light emitting unit EMU2 of the second sub-pixel SPXL2, and first and second serial stages SET1 and SET2 disposed in the third emission area EMA3 may constitute the third sub-light emitting unit EMU3 of the third sub-pixel SPXL3.

Each of the light emitting elements LD may be a light emitting diode having a subminiature size, e.g., a size small to a degree of nanometer scale to micrometer scale, which is manufactured by using a material having an inorganic crystalline structure. Each of the light emitting elements LD may be a subminiature light emitting diode manufactured through an etching process or a subminiature light emitting diode manufactured through a growth process.

At least two light emitting elements LD to a few tens of light emitting elements LD may be aligned and/or provided in each of the first, second, and third emission areas EMA1, EMA2, and EMA3, but the number of the light emitting elements LD is not limited thereto. In some embodiments, the number of light emitting elements LD aligned and/or provided in each of the first, second, and third emission areas EMA1, EMA2, and EMA3 may be variously changed.

Each of the light emitting elements LD may emit any one light selected from colored light and/or white light. in a plan view and a section, each of the light emitting elements LD may be aligned on the first insulating layer INS1 between two adjacent electrodes among the first, second, third, and fourth electrodes EL1, EL2, EL3, and EL4 such that an extending direction (or length direction) of each of the light emitting elements LD is parallel to the first direction DR1. The light emitting elements LD may be provided in a form in which the light emitting elements LD are sprayed in a solution, to be input to each of the first, second, and third emission areas EMA1, EMA2, and EMA3.

The light emitting elements LD may be input to each of the first, second, and third emission areas EMA1, EMA2, and EMA3 of the pixel PXL through an inkjet printing process, a slit coating process, or one of various processes. In an example, the light emitting elements LD may be mixed in a volatile solvent to be supplied to the pixel area (or each of the first, second, and third emission areas EMA1, EMA2, and EMA3) through an inkjet printing process or a slit coating process. In case that an alignment signal corresponding to each of first, second, third, and fourth electrodes EL1, EL2, EL3, and EL4 provided in each of the first, second, and third emission areas EMA1, EMA2, and EMA3 is applied, an electric field may be formed between two adjacent electrodes among the first, second, third, and fourth electrodes EL1, EL2, EL3, and EL4. Therefore, light emitting elements LD may be aligned between the two adjacent electrodes among the first, second, third, and fourth electrodes EL1, EL2, EL3, and EL4. As described above, the same alignment signal (or alignment voltage) is applied to each of the second and third electrodes EL2 and EL3, and therefore, the light emitting elements LD may not be aligned between the second electrode EL2 and the third electrode EL3. However, the disclosure is not limited thereto.

Light emitting elements LD may be finally aligned and/or provided in each of the first, second, and third emission areas EMA1, EMA2, and EMA3 by volatilizing the solvent or removing the solvent through another process after the light emitting elements LD are aligned.

In FIG. 6, it has been illustrated that light emitting elements LD of which extending direction (or length direction) is parallel to the first direction DR1 are aligned between two adjacent electrodes among the first, second, third, and fourth electrodes EL1, EL2, EL3, and EL4. However, the disclosure is not limited thereto. In some embodiments, some of the light emitting elements LD may be aligned between two adjacent electrodes such that an extending direction of the light emitting elements LD is parallel to the second direction DR2 and/or a direction inclined to the second direction DR2. In some embodiments, at least one reverse light emitting element LDr (see FIG. 4) connected in a reverse direction may further be disposed between two adjacent electrodes.

In an embodiment of the disclosure, the light emitting elements LD may include first light emitting elements LD1 and second light emitting elements LD2.

The first light emitting elements LD1 may be disposed between the first electrode EL1 and the second electrode EL2. The second light emitting elements LD2 may be disposed between the third electrode EL3 and the fourth electrode EL4.

The first light emitting elements LD1 may be aligned in the same direction between the first electrode EL1 and the second electrode EL2. The first electrode EL1 and the second electrode EL2 along with the first light emitting elements LD1 connected in parallel in the same direction therebetween may constitute a first serial stage SET1 of each of the first, second, and third sub-light emitting units EMU1, EMU2, and EMU3.

The second light emitting elements LD2 may be aligned in the same direction between the third electrode EL3 and the fourth electrode EL4. The third electrode EL3 and the fourth electrode EL4 along with the second light emitting elements LD2 connected in parallel in the same direction therebetween may constitute a second serial stage SET2 of each of the first, second, and third sub-light emitting units EMU1, EMU2, and EMU3.

The above-described first and second light emitting elements LD1 and LD2 may be provided and/or formed on the first insulating layer INS1 in each of the first, second, and third emission areas EMA1, EMA2, and EMA3.

The second insulating layer INS2 may be provided and/or formed on the above-described light emitting elements LD.

The second insulating layer INS2 may be provided and/or formed on the light emitting elements LD to partially cover an outer circumferential surface (or surface) of each of the light emitting elements LD and to expose both end portions of each of the light emitting elements LD to the outside.

The second insulating layer INS2 may be configured as a single layer or a multi-layer, and include an insulating layer including at least one inorganic material or at least one organic material. The second insulating layer INS2 may include an inorganic layer advantageous in protecting an active layer 12 (see FIG. 1) of each of the light emitting elements LD from external oxygen, external moisture, and the like. However, the disclosure is not limited thereto, and the second insulating layer INS2 may be configured as an organic layer according to a design condition of the display device DD to which the light emitting elements LD are applied. After light emitting elements LD are completely aligned in each of the first, second, and third emission areas EMA1, EMA2, and EMA3, the second insulating layer INS2 is formed on the light emitting elements LD, so that the light emitting elements LD can be prevented from being separated at positions at which the light emitting elements LD are aligned.

In case that an empty gap (or space) exists between the first insulating layer INS1 and the light emitting elements LD before the second insulating layer INS2 is formed, the empty gap may be filled with the second insulating layer INS2 in a process of forming the second insulating layer INS2. The second insulating layer INS2 may be configured with an organic insulating layer advantageous in filling the empty gap between the first insulating layer INS1 and the light emitting elements LD.

In each of the first, second, and third emission areas EMA1, EMA2, and EMA3, first and second pixel electrodes CNE1 and CNE2 and an intermediate electrode CTE may be components which electrically connect the light emitting elements LD to each other.

The first pixel electrode CNE1 may be provided (or disposed) and/or formed on the first electrode EL1 and an end portion of each of the first light emitting elements LD. The first pixel electrode CNE1 may be electrically connected to the end portion of each of the first light emitting elements LD. Also, the first pixel electrode CNE1 may be connected to the 2bth power line PL2*b*. For example, the first pixel electrode CNE1 may be in direct contact with the 2bth power line PL2*b* through a first via hole VIH1. In another example, the first pixel electrode CNE1 may be in contact with the first electrode EL1, and be electrically connected to the first electrode EL1 and the 2bth power line PL2*b* through the first via hole VIH1.

The second pixel electrode CNE2 may be disposed on the third electrode EL3 and another end portion of each of the second light emitting elements LD2. The second pixel electrode CNE2 may be electrically connected to another end portion of each of the second light emitting elements LD2. Also, the second pixel electrode CNE2 may be connected to a corresponding upper electrode among the upper electrodes UE1 to UE3. For example, the second pixel electrode CNE2 may be in direct contact with the upper electrode through a second via hole VIH2. In another example, the second pixel electrode CNE2 may be in contact with the third electrode EL3, and be electrically connected to the upper electrode through the third electrode EL3 and the second via hole VIH2.

Each of the first and second pixel electrodes CNE1 and CNE2 may have a bar shape extending along the second direction DR2 in a plan view, but the disclosure is not limited thereto. In some embodiments, the shape of each of the first and second pixel electrodes CNE1 and CNE2 may be variously changed within a range in which each of the first and second pixel electrodes CNE1 and CNE2 is electrically stably connected to one/another end portion of the light emitting element LD. Also, the shape of each of the first and second pixel electrodes CNE1 and CNE2 may be variously changed by considering a connection relationship with the first and third electrodes EL1 and EL3 disposed on the bottom of the first and second pixel electrodes CNE1 and CNE2.

The first and second pixel electrodes CNE1 and CNE2 may be configured with various transparent conductive materials. In an example, the first and second pixel electrodes CNE1 and CNE2 may include at least one of various transparent conductive materials including indium tin oxide (ITO), indium zinc oxide (IZO), zinc oxide (ZnO), indium gallium zinc oxide (IGZO), indium tin zinc oxide (ITZO), and the like, and be configured substantially transparently or translucently to satisfy a transmittancy (or transmittance). However, the material of the first and second pixel electrodes CNE1 and CNE2 is not limited to the above-described embodiment. In some embodiments, the first and second pixel electrodes CNE1 and CNE2 may be configured with various opaque conductive materials. The first and second pixel electrodes CNE1 and CNE2 may be formed as a single layer or a multi-layer. In an embodiment, the first and second pixel electrodes CNE1 and CNE2 may correspond to the fifth conductive layer provided (disposed) and/or formed on the second insulating layer INS2.

The first pixel electrode CNE1 and the second pixel electrode CNE2 may be provided in the same layer and be formed through the same process. However, the disclosure is not limited thereto. In some embodiments, the first pixel electrode CNE1 and the second pixel electrode CNE2 may be provided in different layers, and be formed through different processes. Another insulating layer (not shown) may be provided and/or formed between the first pixel electrode CNE1 and the second pixel electrode CNE2. The another insulating layer may be provided over one pixel electrode selected from the first pixel electrode CNE1 and the second pixel electrode CNE2 to cover the one pixel electrode not to be exposed to the outside, thereby preventing corrosion of the one pixel electrode. The another insulating layer may include an inorganic layer or an organic layer. Also, the another insulating layer may be formed as a single layer or a multi-layer.

The intermediate electrode CTE may include a first intermediate electrode CTE1 and a second intermediate electrode CTE2, which extend in the second direction DR2.

The first intermediate electrode CTE1 may be provided on the second electrode EL2, and overlap the second electrode EL2 in a plan view. The first intermediate electrode CTE1 may be disposed on the first insulating layer INS1 over the second electrode ELT2 to be electrically insulated (or separated) from the second electrode EL2. The first intermediate electrode CTE1 may be disposed on the other end portion of first light emitting elements LD1 in each of the first, second, and third emission areas EMA1, EMA2, and EMA3 to be electrically and/or physically connected to the first light emitting elements LD1.

The second intermediate electrode CTE2 may be provided on the fourth electrode EL4, and overlap the fourth electrode EL4 in a plan view. The second intermediate electrode CTE2 may be disposed on the first insulating layer INS1 over the fourth electrode EL4 to be electrically insulated (or separated) from the fourth electrode EL4. The second intermediate electrode CTE2 may be disposed on an end portion of each of second light emitting elements LD2 in each of the first, second, and third emission areas EMA1, EMA2, and EMA3 to be electrically and/or physically connected to the second light emitting elements LD2.

The first intermediate electrode CTE1 and the second intermediate electrode CTE2 may be integrally provided to be connected to each other. The first intermediate electrode CTE1 and the second intermediate electrode CTE2 may be different areas of the intermediate electrode CTE. The first intermediate electrode CTE1 may be the same component as the first intermediate electrode CTE1 described with reference to FIG. 4, and the second intermediate electrode CTE2 may be the same component as the second intermediate electrode CTE2 described with reference to FIG. 4. The intermediate electrode CTE may serve a bridge electrode (or connection member) which electrically connects an end portion of each of the second light emitting elements LD2 of the first serial stage SET1 and another end portion of each of the first light emitting elements LD1 of the second serial stage SET2. For example, the first serial stage SET1 and the second serial stage SET2 may be connected to each other through the intermediate electrode CTE.

In an embodiment, an end portion of each of the first light emitting elements LD1 and an end portion of each of the second light emitting elements LD2 may include the same type of semiconductor layer (e.g., the first semiconductor layer 11 shown in FIG. 1). Another end portion of each of the first light emitting elements LD1 and another end portion of each of the second light emitting elements LD2 may include the same type of semiconductor layer (e.g., the second semiconductor layer 12 shown in FIG. 1).

The intermediate electrode CTE including the first intermediate electrode CTE1 and the second intermediate electrode CTE2 may be spaced apart from the second pixel electrode CNE2 in a plan view, and may be provided in a shape surrounding at least a portion of the second pixel electrode CNE2. However, the disclosure is not limited thereto. In some embodiments, the intermediate electrode CTE may be modified in various shapes within a range in which the Intermediate electrode CTE stably connects the first serial stage SET1 and the second serial stage SET2, which may be consecutive, to each other. In an embodiment, the first pixel electrode CNE1, the second pixel electrode CNE2, and the intermediate electrode CTE may be disposed to be spaced apart from each other in plan view and in sectional view.

The intermediate electrode CTE may be configured with various transparent materials. In an example, the intermediate electrode CTE may include the same material as the first and second pixel electrodes CNE1 and CNE2 or include at least one material selected from the materials disclosed as the material constituting the first and second pixel electrodes CNE1 and CNE2.

The intermediate electrode CTE may be provided in the same layer as the first and second pixel electrodes CNE1 and CNE2 to be formed through the same process as the first and second pixel electrodes CNE1 and CNE2. In an example, the intermediate electrode CTE and the first and second pixel electrodes CNE1 and CNE2 may be provided and/or formed on the second insulating layer INS2. However, the disclosure is not limited thereto. In some embodiments, the intermediate electrode CTE may be provided in a layer different from the layer of the first and second pixel electrodes CNE1 and CNE2, and be formed through a process different from the process of the first and second pixel electrodes CNE1 and CNE2.

The third insulating layer INS3 may be provided and/or formed over the first pixel electrode CNE1, the second pixel electrode CNE2, and the intermediate electrode CTE. The third insulating layer INS3 may be an inorganic layer or an organic layer. In an example, the third insulating layer INS3 may have a structure in which at least one inorganic layer and at least one organic layer are alternately stacked on each other. The third insulating layer INS3 may entirely cover the display element layer DPL, thereby blocking external moisture, external humidity, or the like from being introduced into the display element layer DPL including the light emitting elements LD.

In case that a driving current flows from the first power line PL1 to the second power line PL2 due to the first thin film transistor T1 of each of the first, second, and third sub-pixels SPXL1, SPXL2, and SPXL3, the driving current may be introduced into a sub-light emitting unit of the corresponding sub-pixel through a second via hole VIH2 of the corresponding sub-pixel.

In an example, the driving current may flow through the intermediate electrode CTE via the second light emitting element LD through the second via hole VIH2 and the second pixel electrode CNE2 of the first sub-pixel SPXL1. Accordingly, each of the second light emitting elements LD2 in the first serial stage SET of the first sub-pixel SPXL may emit light with a luminance corresponding to a current distributed thereto. The driving current flowing through intermediate electrode CTE may flow through the first pixel electrode CTE1 via the intermediate electrode CTE and the first light emitting elements LD. Accordingly, each of the first light emitting elements LD1 in the second serial stage SET of the first sub-pixel SPXL may emit light with a luminance corresponding to a current distributed thereto.

In the above-described manner, a driving current of each of the first, second, and third sub-pixels SPXL1, SPXL2, and SPXL3 may flow while sequentially passing through the second light emitting elements LD2 of the first serial stage SET1 and the first light emitting elements LD1 of the second serial stage SET2. Accordingly, each of the first, second, and third sub-pixels SPXL1, SPXL2, and SPXL3 may emit light with a luminance corresponding to a data signal supplied during each frame period.

In accordance with the above-described embodiments, the intermediate electrode CTE may be simultaneously formed in a process of forming the first pixel electrode CNE1 and the second pixel electrode CNE2. Accordingly, a process of manufacturing the first, second, and third sub-pixels SPXL1, SPXL2, and SPXL3 and the display device DD including the same is simplified, so that a product yield can be improved.

Also, in accordance with the above-described embodiments, as the first, second, and third sub-light emitting units EMU1, EMU2, and EMU3 having a series/parallel hybrid structure are configured, the pixel PXL is stably driven, so that a driving current flowing through the display panel of the display device DD is lowered, thereby improving power consumption efficiency.

In some embodiments, at least one overcoat layer (e.g., a layer for planarizing a top surface of the display element layer DPL) may be further disposed on the top of the third insulating layer INS3.

In accordance with another embodiment, the display element layer DPL of each of the first, second, and third sub-pixels SPXL1, SPXL2, and SPXL3 may be configured to selectively further include an optical layer. In an example, the display element layer DPL may further include a color conversion layer including color conversion particles for converting light emitted from light emitting elements LD into light of a specific color.

Figure 9:
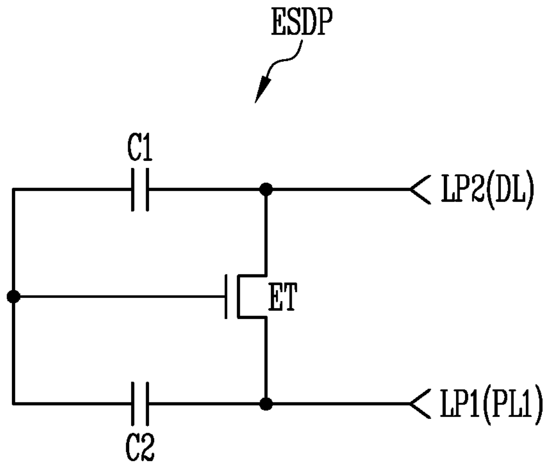
FIG. 9 is a circuit diagram schematically illustrating an embodiment of an electrostatic discharge prevention part included in the display device shown in FIG. 3.

FIG. 9 is a circuit diagram schematically illustrating an embodiment of the electrostatic discharge prevention part included in the display device shown in FIG. 3.

Referring to FIGS. 3 to 9, the electrostatic discharge prevention part ESDP (or electrostatic discharge prevention circuit) may include at least one transistor ET having a mutual connection relationship with the first fan-out line LP1 and the second fan-out line LP2. The electrostatic discharge prevention part ESDP may be designed to have low impedance in a high voltage area, so that the introduction of static electricity is blocked by allowing overcurrent to be discharged or by being self-destroyed. Also, the electrostatic discharge prevention part ESDP may be designed to have high impedance in a normal driving environment, so that a signal supplied through the first fan-out line LP1 and the second fan-out line LP2 is not influenced.

The electrostatic discharge prevention part ESDP may include the transistor ET, a first capacitor C1, and a second capacitor C2.

The transistor ET may be connected between the second fan-out line LP2 to which a data signal of the driver DIC may be supplied and the first fan-out line LP1 to which the voltage of the first driving power source may be supplied.

The first capacitor C1 may be connected or formed between a gate electrode of the transistor ET and a first terminal (or source electrode) of the transistor ET, and the second capacitor C2 may be connected or formed between the gate electrode of the transistor ET and a second terminal (or drain electrode) of the transistor ET. The gate electrode of the transistor ET may be floated.

Figure 10:
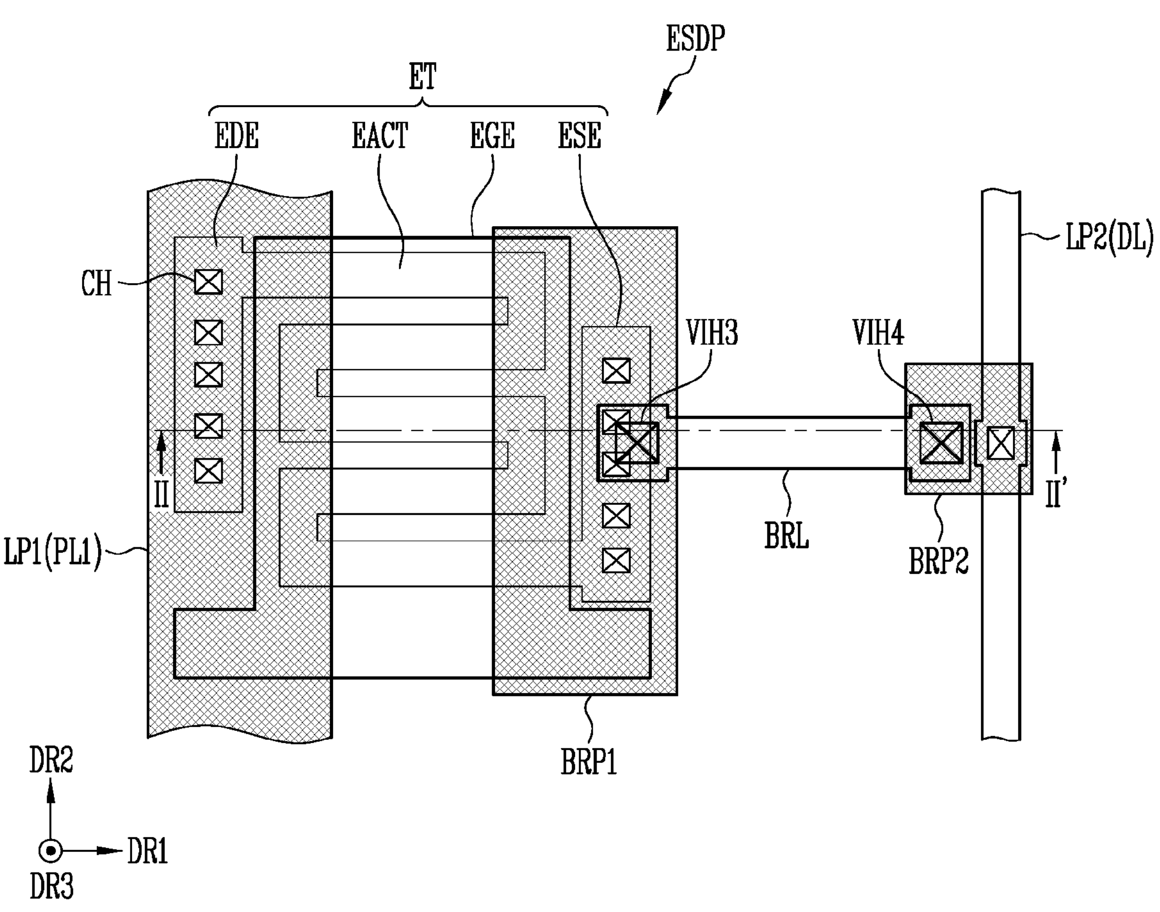
FIG. 10 is a plan view schematically illustrating an embodiment of the electrostatic discharge prevention part shown in FIG. 9.
Figure 11:
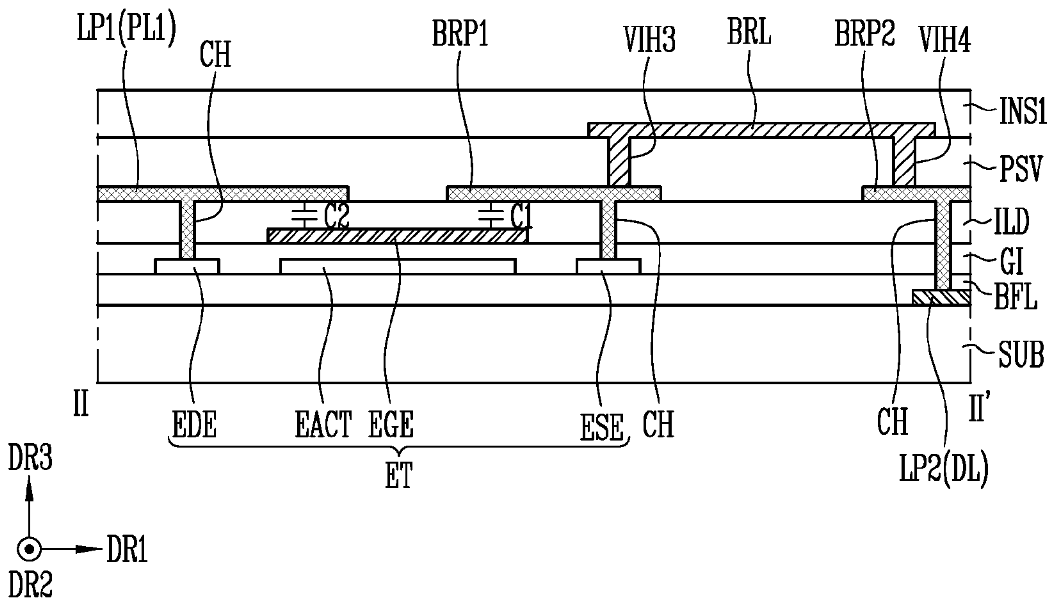
FIG. 11 is a schematic sectional view taken along line II-II' shown in FIG. 10.

FIG. 10 is a plan view schematically illustrating an embodiment of the electrostatic discharge prevention part shown in FIG. 9. FIG. 11 is a schematic sectional view taken along line II-II' shown in FIG. 10.

In relation to the electrostatic discharge prevention part ESDP shown in FIGS. 10 and 11, portions different from those of the above-described embodiments will be described to avoid redundancy.

Referring to FIGS. 3 and 8 to 11, the electrostatic discharge prevention part ESDP may include a transistor ET connected between the first fan-out line LP1 (or the first power line PL1) and the second fan-out line LP2 (or the data line DL) in the electrostatic discharge prevention circuit area ESDPA.

The first fan-out line LP1 and the second fan-out line LP2 may extend along the second direction DR2. The voltage of the first driving power source may be transferred to the first fan-out line LP1 from the driver DIC, and a data signal may be transferred to the second fan-out line LP2 from the driver DIC.

In a plan view, the first fan-out line LP1 and the second fan-out line LP2 may be disposed to be spaced apart from each other in the first direction DR1. In an embodiment, the first fan-out line LP1 may correspond to a third conductive layer disposed on a substrate SUB, and the second fan-out line LP2 may correspond to a first conductive layer disposed on the substrate SUB. The substrate SUB may be the substrate SUB described with reference to FIGS. 5 to 8.

The first fan-out line LP1 may be provided in the same layer as the first scan line S1 described with reference to FIGS. 5 to 8, include the same material as the first scan line S1, and be formed through the same process as the first scan line S1. In an example, the first fan-out line LP1 may be provided and/or formed on an interlayer insulating layer ILD. The second fan-out line LP2 may be provided in the same layer as the first, second, and third bottom metal layers BML1, BML2, and BML3 described with reference to FIGS. 5 to 8, include the same material as the first, second, and third bottom metal layers BML1, BML2, and BML3, and be formed through the same process as the first, second, and third bottom metal layers BML1, BML2, and BML3. The interlayer insulating layer ILD may be the interlayer insulating layer ILD described with reference to FIGS. 5 to 8.

The electrostatic discharge prevention part ESDP may include the transistor ET, a first capacitor C1, and a second capacitor C2.

The transistor ET may include a gate electrode EGE, an active pattern FACT, a source region ESE, and a drain region EDE.

The gate electrode EGE may be provided in a shape such as an isolated island, and be floated. The gate electrode EGE may correspond to a second conductive layer, and be provided and/or formed on a gate insulating layer GI. The gate electrode EGE may be provided in the same layer as the first and second connection lines CNL1 and CNL2 described with reference to FIGS. 5 to 8, include the same material as the first and second connection lines CNL1 and CNL2, and be formed through the same process as the first and second connection lines CNL1 and CNL2. The gate insulating layer GI may be the gate insulating layer GI described with reference to FIGS. 5 to 8.

Each of the active pattern FACT, the source region ESE, and the drain region EDE may be a semiconductor pattern made of poly-silicon, amorphous silicon, an oxide semiconductor, and/or the like. Each of the active pattern FACT, the source region ESE, and the drain region EDE may be formed as a semiconductor layer undoped or doped with an impurity. In an example, each of the source region ESE and the drain region EDE may be configured as a semiconductor layer doped with the impurity, and the active pattern FACT may be configured as a semiconductor layer undoped with the impurity. In an example, an n-type impurity may be used as the impurity, but the disclosure is not limited thereto.

The active pattern FACT, the source region ESE, and the drain region EDE may be provided and/or formed on a buffer layer BFL.

The active pattern FACT may have a shape which extends in a direction and is bent plural times along a length direction in which the active pattern FACT extends. The active pattern FACT may overlap the gate electrode EGE. The active pattern FACT may be formed long, so that a channel region of the transistor ET can be formed long.

The source region ESE may be connected to (or in contact with) an end of the active pattern FACT. Also, the source region ESE may be electrically and/or physically connected to the second fan-out line LP2 through a first bridge pattern BRP1, a bridge line BRL, and a second bridge pattern BRP2.

The first bridge pattern BRP1 and the second bridge pattern BRP2 may correspond to the third conductive layer provided (or disposed) and/or formed on the interlayer insulating layer ILD. The first bridge pattern BRP1 and the second bridge pattern BRP2 may be provided in the same layer as the first fan-out line LP1. The first bridge pattern BRP1 may be connected to the source region ESE through a contact hole CH sequentially penetrating the gate insulating layer GI and the interlayer insulating layer ILD. The second bridge pattern BRP2 may be connected to the second fan-out line LP2 through a contact hole CH sequentially penetrating the buffer layer BFL, the gate insulating layer GI, and the interlayer insulating layer ILD.

The drain region EDE may be connected to (or in contact with) another end of the active pattern FACT. Also, the drain region EDE may be connected to the first fan-out line LP1 through a corresponding contact hole CH. In an example, the drain region EDE may be connected to the first fan-out line LP1 through a contact hole CH sequentially penetrating the gate insulating layer GI and the interlayer insulating layer ILD.

The first capacitor C1 may include an upper electrode and a lower electrode. The upper electrode may be an area of the first bridge pattern BRP1 electrically connected to the second fan-out line LP2, and the lower electrode may be an area of the gate electrode EGE. For example, the first bridge pattern BRP1 and the gate electrode EGE, which may overlap with each other with the interlayer insulating layer ILD interposed therebetween, may be respectively used as the upper electrode and the lower electrode of the first capacitor C1.

The second capacitor C2 may include an upper electrode and a lower electrode. The upper electrode may be an area of the first fan-out line LP1 (or the first power line PL1), and the lower electrode may be an area of the gate electrode EGE. For example, the first fan-out line LP1 and the gate electrode EGE, which may overlap each other with the interlayer insulating layer ILD interposed therebetween, may be respectively used as the upper electrode and the lower electrode of the second capacitor C2.

A protective layer PSV may be provided and/or formed over the first fan-out line LP1, the first bridge pattern BRP1, and the second bridge pattern BRP2. The protective layer PSV may be the protective layer PSV described with reference to FIGS. 5 to 8.

The bridge line BRL may correspond to a fourth conductive layer provided and/or formed on the protective layer PSV. The bridge line BRL may be provided in the same layer as the first, second, third, and fourth electrodes EL1, EL2, EL3, and EL4. The bridge line BRL and the first, second, third, and fourth electrodes EL1, EL2, EL3, and EL4 may include the same material and be formed through the same process. An end of the bridge line BRL may be connected to the first bridge pattern BRP1 through a third via hole VIH3 penetrating the protective layer PSV. Another end of the bridge line BRL may be connected to the second bridge pattern BRP2 through a fourth via hole VIH4 penetrating the protective layer PSV.

The first bridge pattern BRP1 and the second bridge pattern BRP2 may not be directly connected to each other or integrally formed, but may be connected to each other through the bridge line BRL disposed in a layer different from the layer of the first bridge pattern BRP1 and the second bridge pattern BRP2. The first bridge pattern BRP1 and the second bridge pattern BRP2 can be readily separated from each other after the display device DD is manufactured or in a process of manufacturing the display device DD. For example, the electrostatic discharge prevention part ESDP can be readily separated from the data line DL, and occurrence of a defect caused by the electrostatic discharge prevention part ESDP can be prevented. This will be described later with reference to FIGS. 14 and 15.

A first insulating layer INS1 may be provided and/or formed over the bridge line BRL. The first insulating layer INS1 may be the first insulating layer INS1 described with reference to FIGS. 5 to 8.

Figure 12:
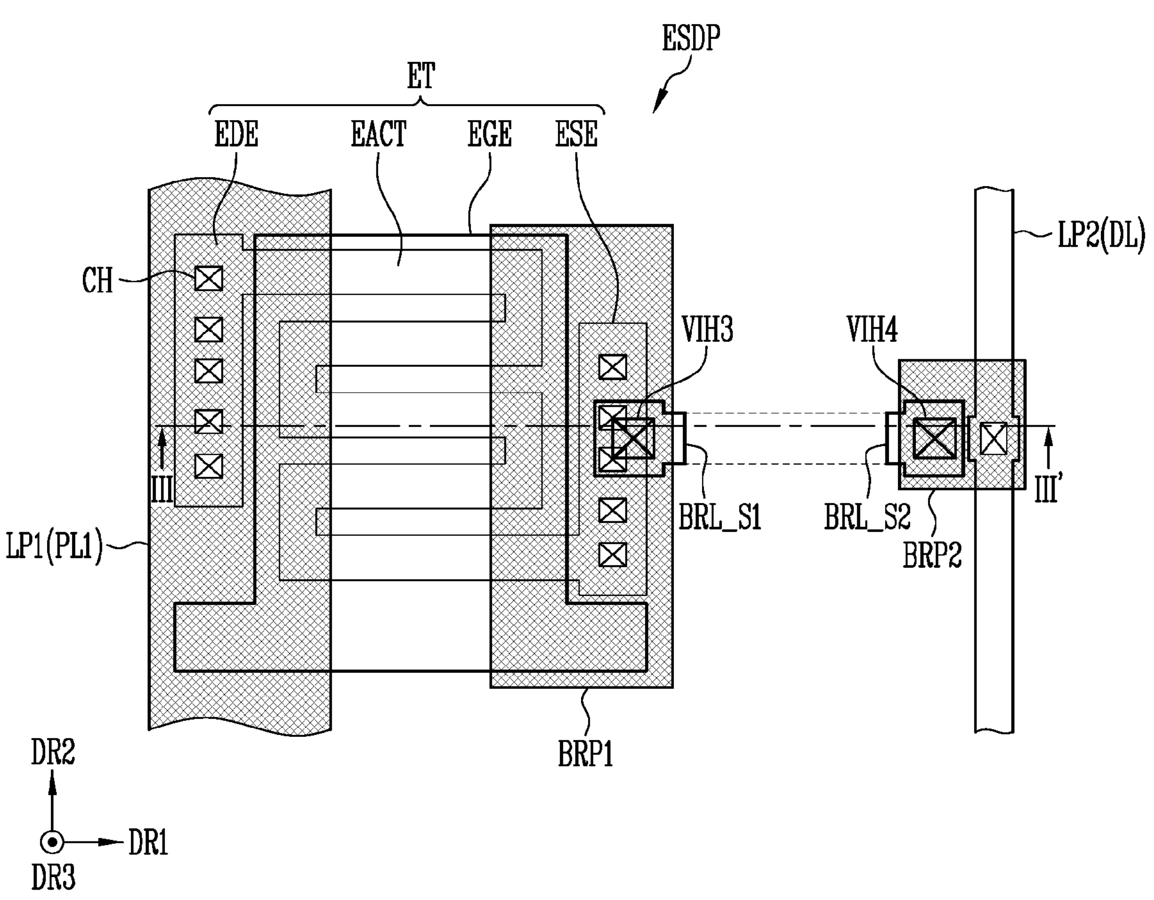
FIG. 12 is a plan view schematically illustrating another embodiment of the electrostatic discharge prevention part shown in FIG. 9.
Figure 13:
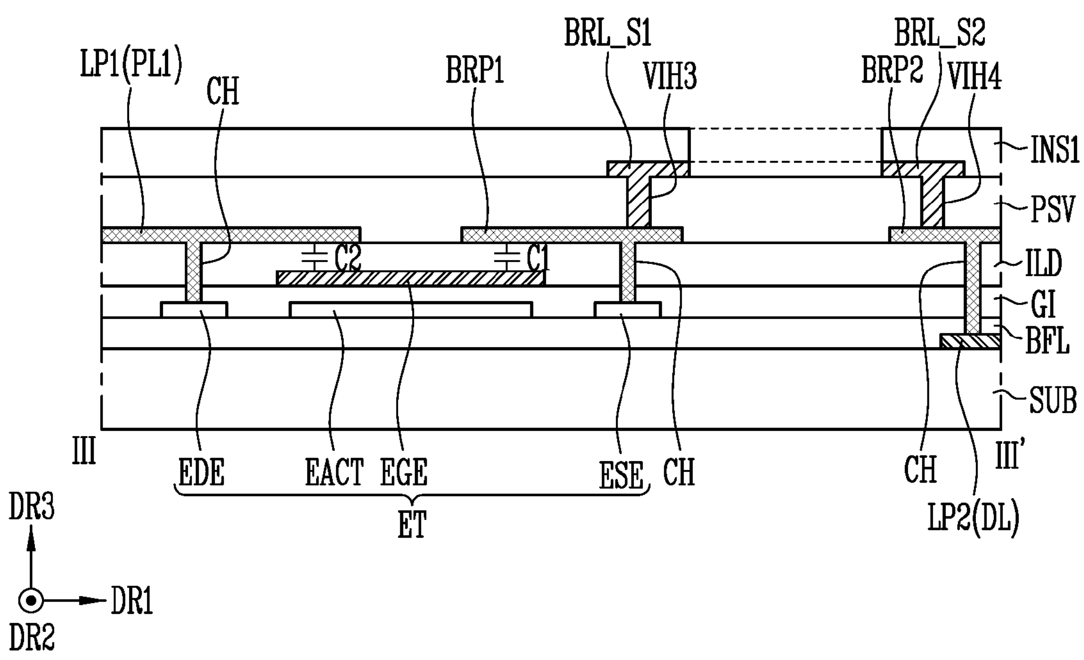
FIG. 13 is a schematic sectional view taken along line III-III' shown in FIG. 12.

FIG. 12 is a plan view schematically illustrating another embodiment of the electrostatic discharge prevention part shown in FIG. 9. FIG. 13 is a schematic sectional view taken along line III-III' shown in FIG. 12.

In relation to the electrostatic discharge prevention part ESDP shown in FIGS. 12 and 13, portions different from those of the above-described embodiment (e.g., an embodiment shown in FIGS. 10 and 11) will be described to avoid redundancy.

Referring to FIGS. 3 and 8 to 13, a portion of the bridge line BRL shown in FIGS. 10 and 11 may be removed to be a first sub-bridge line BRL_S1 (or first pattern) and a second bridge line BRL_S2 (or second pattern). The electrostatic discharge prevention part ESDP may be electrically separated from the second fan-out line LP2 (or the data line DL).

For example, a portion of the bridge line BRL may be removed through laser cutting. A portion of the first insulating layer INS1, which corresponds to the portion of the bridge line BRL, may also be removed.

In an embodiment, in a process of removing and separating a portion of each of the first, second, third, and fourth electrodes EL1, EL2, EL3, and EL4, the portion of the bridge line BRL may be removed. For example, the portion of each of the first, second, third, and fourth electrodes EL1, EL2, EL3, and EL4 and the portion of the bridge line BRL may be removed through the same process. For example, as described with reference to FIGS. 6 to 8, the portion of each of the first, second, third, and fourth electrodes EL1, EL2, EL3, and EL4 and the portion of the bridge line BRL may be removed, after light emitting elements LD are aligned on the first insulating layer INS1.

In another embodiment, after the display device DD shown in FIG. 3 is completely manufactured, the portion of the bridge line BRL may be removed. For example, in an inspection process of the display device DD shown in FIG. 3 or a repair process after the inspection process, the portion of the bridge line BRL may be removed. For example, an inspection on whether the driver DIC of the display device DD shown in FIG. 3 has been normally connected to the data line DL may be performed, or an inspection of measuring a contact resistance between the driver DIC and the pads P may be performed. The portion of the bridge line BRL may be removed based on a result of the inspection.

For example, in a manufacturing process of the display device DD or after the display device DD is completely manufactured, the portion of the bridge line BRL may be removed. In a state in which the display device DD is completely manufactured, the protective layer PSV may be removed so as to separate the first and second bridge patterns BRP1 and BRP2 which may be integrally formed from each other, and damage of the display device DD (or the pixel circuit layer PCL) (see FIGS. 7 and 8) may occur in a process of removing portions of the protective layer PSV and the first and second bridge patterns BRP1 and BRP2. Therefore, the bridge line BRL connecting the first and second bridge patterns BRP1 and BRP2 to each other may be separately provided on the top of the protective layer PSV, and the first and second bridge patterns BRP1 and BRP2 (or the electrostatic discharge prevention part ESDP) and the data line DL may be readily electrically separated from each other in a manner that removes a portion of the bridge line BRL. In particular, the electrostatic discharge prevention part ESDP may be separated from the data line DL in the same manner as a process of partially removing or separating the first, second, third, and fourth electrodes EL1, EL2, EL3, and EL4.

Figure 14:
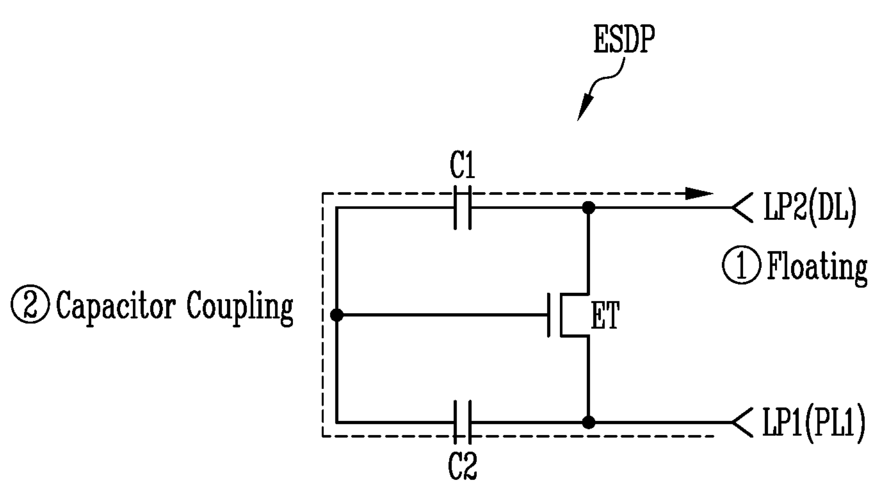
FIGS. 14 and 15 are circuit diagrams schematically illustrating an operation of the electrostatic discharge prevention part shown in FIG. 9.
Figure 15:
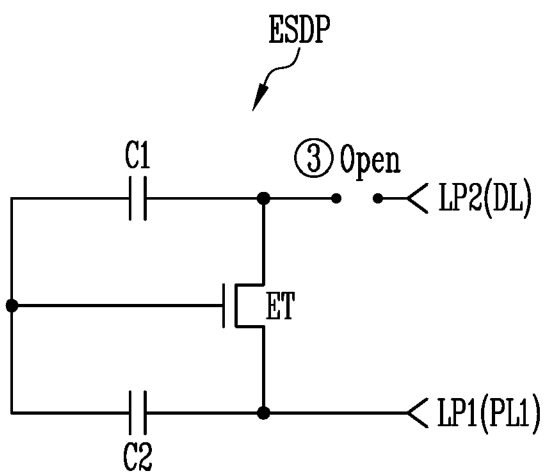

FIGS. 14 and 15 are circuit diagrams schematically illustrating an operation of the electrostatic discharge prevention part shown in FIG. 9.

Referring to FIGS. 3, 9, 14, and 15, a case where a contact between the driver DIC and the pad P is defective may be assumed. A contact between the driver DIC and the second fan-out line LP2 (or the data line DL) may be opened, and the second fan-out line PL2 may be in a floating state in which any signal is not applied. Subsequently, a voltage of a driving power source may be applied to the first fan-out line LP (or the first power line PL1) so as to drive the display device DD. The first fan-out line LP1 and the second fan-out line LP2 may be in a state in which the first fan-out line LP1 and the second fan-out line LP2 are capacitor-coupled (connected) by the first and second capacitors C1 and C2, and therefore, the voltage of the first power line PL1 (i.e., the voltage of the driving power source) may be applied to the second fan-out line LP2 (or the data line DL). With respect to the sub-pixel SPXL shown in FIG. 4, the voltage of the first power line PL1 (i.e., a voltage higher than a maximum voltage of the data signal as the voltage of the first driving power source VDD) may be applied to the first node N1, and a transient current may flow in the second power line PL2 through the sub-pixel SPXL from the first power line PL1. The sub-pixel SPXL (and sub-pixels connected to the same data line DL) may emit light with a very high luminance, and burn may occur due to damage of the sub-pixel SPXL or transient current. Therefore, in case that an unintended bright line occurs or is expected to occur in the display device DD as the sub-pixels connected to the data line DL emit light with a very high luminance, the electrostatic discharge prevention part ESDP may be separated from the data line DL.

As shown in FIG. 15, one electrode of the first capacitor C1 (and a first terminal of the transistor ET) and the second fan-out line LP2 (or the data line DL) in the electrostatic discharge prevention part ESDP may be opened, so that the electrostatic discharge prevention part ESDP is electrically separated from the data line DL.

Figure 16:
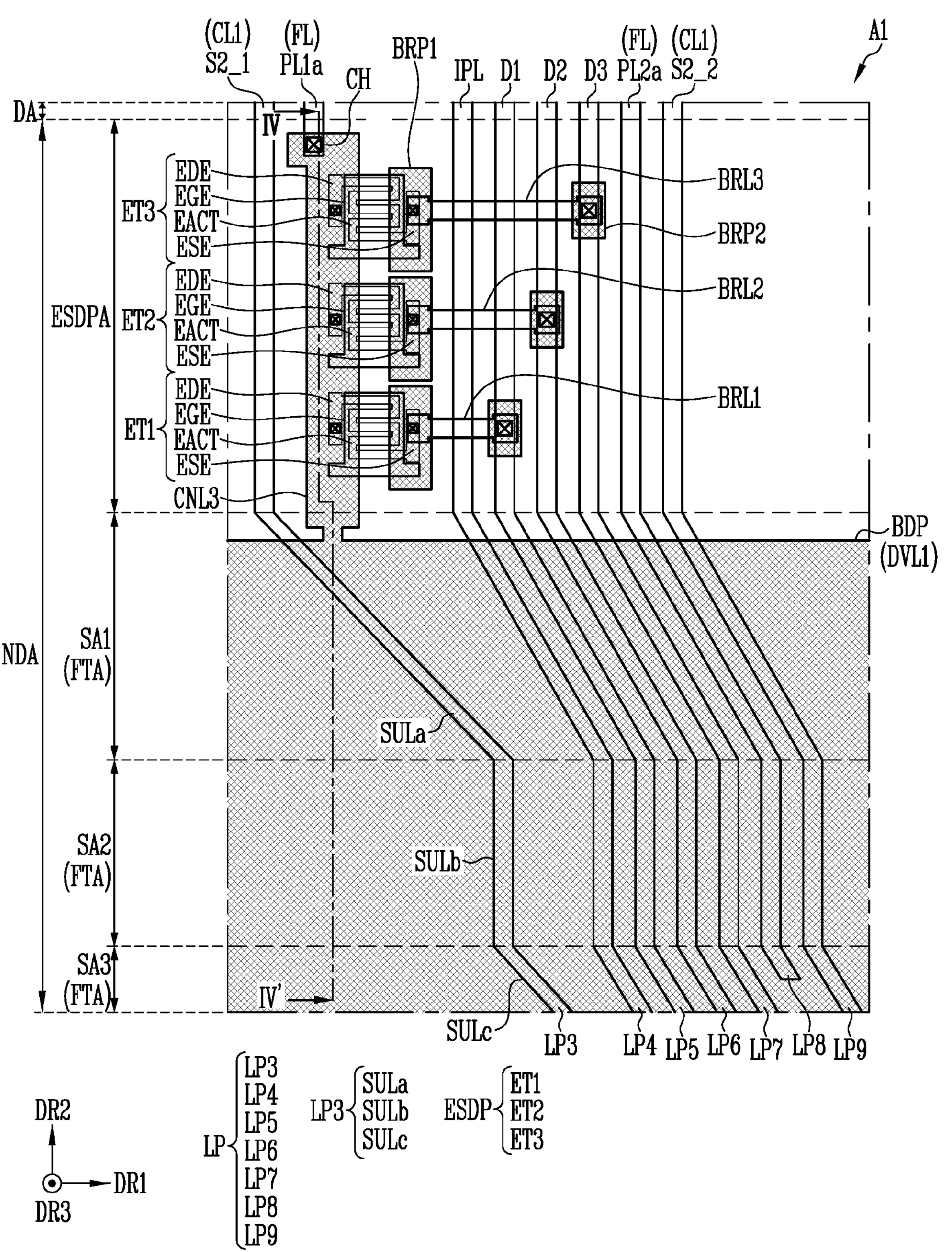
FIGS. 16 and 17 are schematic enlarged views of a first area of the display device shown in FIG. 3.
Figure 17:
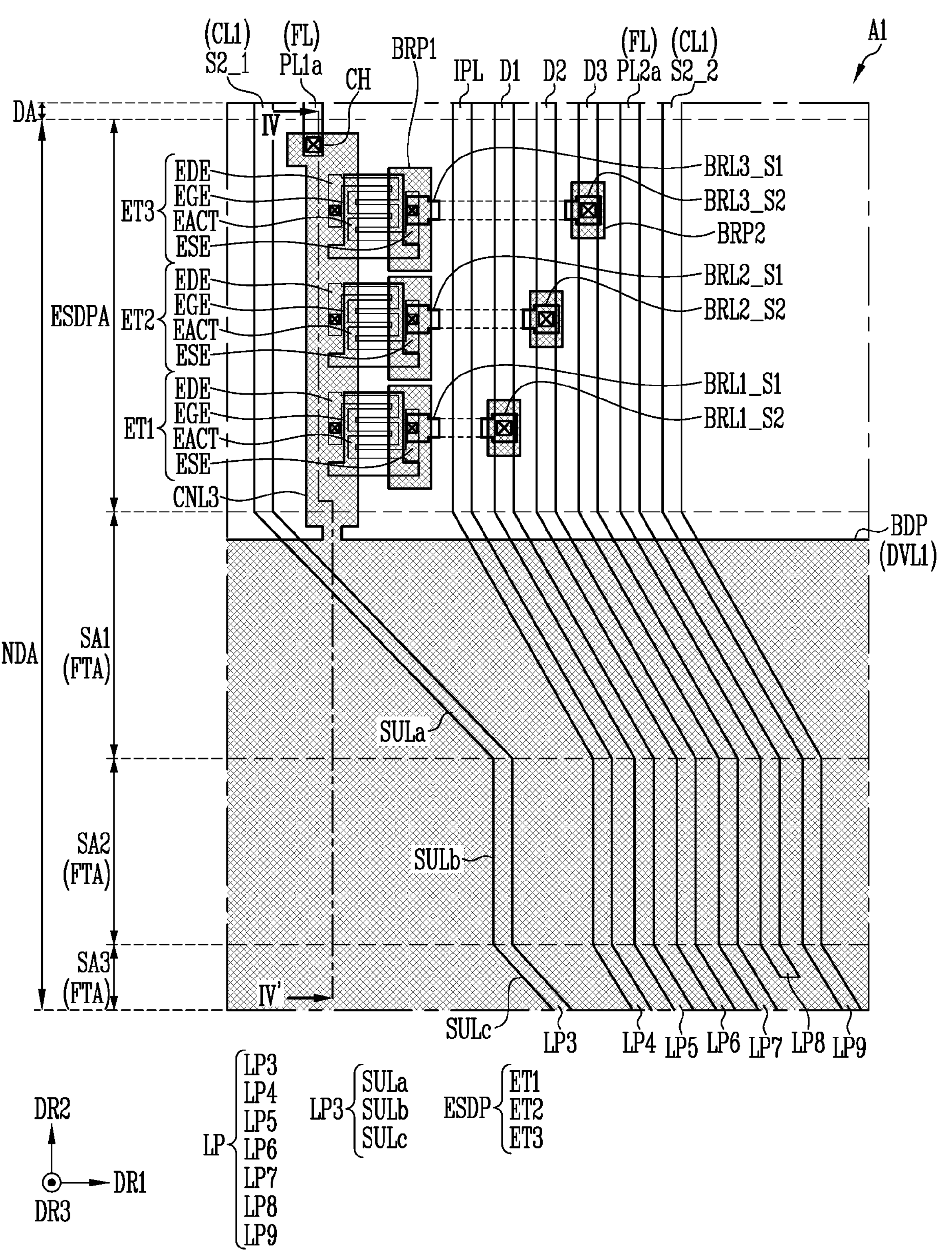
Figure 18:
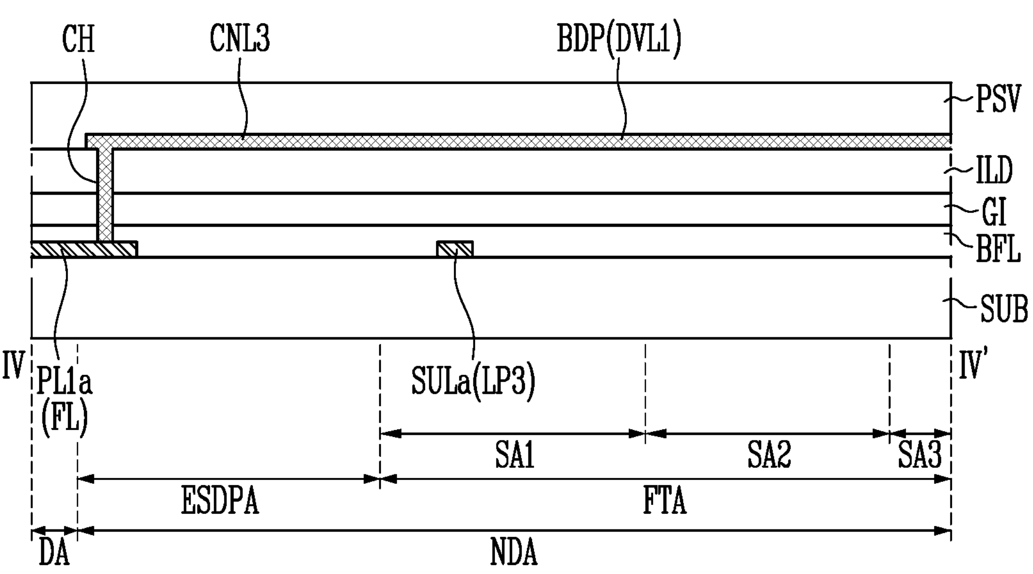
FIG. 18 is a schematic sectional view taken along line IV-IV' shown in FIG. 17.

FIGS. 16 and 17 are schematic enlarged views of the first area of the display device shown in FIG. 3. FIG. 18 is a schematic sectional view taken along line IV-IV' shown in FIG. 17.

In relation to FIGS. 16 to 18, portions different from those of the above-described embodiments will be described to avoid redundancy.

Referring to FIGS. 3 and 9 to 18, the non-display area NDA may be partitioned in an order of the electrostatic discharge prevention circuit area ESDPA, the first sub-area SA1, the second sub-area SA2, and the third sub-area SA3 in a direction facing the driver DIC from the first area A1 of the display area DA.

Three electrostatic discharge prevention parts ESDP located on the same column along the second direction DR2 may be located in the electrostatic discharge prevention circuit area ESDPA of the non-display area NDA. In an example, one of the three electrostatic discharge prevention parts ESDP may include a first transistor ET1 connected to a first data line D1 through a first bridge line BRL1, another of the three electrostatic discharge prevention parts ESDP may include a second transistor ET2 connected to a second data line D2 through a second bridge line BRL2, and the other of the three electrostatic discharge prevention parts ESDP may include a third transistor ET3 connected to a third data line D3 through a third bridge line BRL3. The above-described first, second, and third data lines D1, D2, and D3 may be the first, second, and third data lines D1, D2, and D3 described with reference to FIGS. 5 to 8. Each of the first, second, and third transistors ET1, ET2, and ET3 may be identical to the transistor ET described with reference to FIGS. 9 to 11, and therefore, detailed descriptions of each of the first, second, and third transistors ET1, ET2, and ET3 will be omitted.

A source region ESE of the first transistor ET1 may be connected to the first data line D1 through a first bridge pattern BRP1, the first bridge line BRL1, and a second bridge pattern BRP2. A source region ESE of the second transistor ET2 may be connected to the second data line D2 through the first bridge pattern BRP1, the second bridge line BRL2, and the second bridge pattern BRP2. A source region ESE of the third transistor ET3 may be connected to the third data line D2 through the first bridge pattern BRP1, the third bridge line BRL3, and the second bridge pattern BRP2. The first bridge pattern BRP1 and the second bridge pattern BRP2 may be respectively identical to the first bridge pattern BRP1 and the second bridge pattern BRP2, which are described with reference to FIGS. 10 and 11. Each of the first, second, and third bridge lines BRL1, BRL2, and BRL3 may be the bridge line BRL described with reference to FIGS. 10 and 11. The first, second, and third bridge lines BRL1, BRL2, and BRL3 may extend in the first direction DR1 while traversing at least one of an initialization power line, the first data line D1, and the second data line D2.

The above-described three electrostatic discharge prevention parts ESDP may share a third connection line CNL3. The above-described third connection line CNL3 may be the first fan-out line LP1 described with reference to FIGS. 10 and 11. A drain region EDE of the first transistor ET1 may be connected to the third connection line CNL3, a drain region EDE of the second transistor ET2 may be connected to the third connection line CNL3, and a drain region EDE of the third transistor ET3 may be connected to the third connection line CNL3.

An end of the third connection line CNL3 may be electrically and physically connected to a first layer FL of a lath power line PL1*a* of the display area DA through a contact hole CH sequentially penetrating the buffer layer BFL, the gate insulating layer GI, and the interlayer insulating layer ILD. Another end of the third connection line CNL3 may be integrally provided (or formed) with a first driving voltage line DVL1 (or a body part BDP of the first driving voltage line DVL1) to be electrically and physically connected to the first driving voltage line DVL1. The first layer FL of the lath power line PL1*a* may be electrically connected to the first driving voltage line DVL1 such that the voltage of the first driving power source, which may be applied to the first driving voltage line DVL1, is supplied to the lath power line PL1*a*.

The first driving voltage line DVL1 may be integrally provided (or formed) with the first power pad of the pad part PD shown in FIG. 3, and be electrically connected to the driver DIC. The first driving voltage line DVL1 may correspond to the first fan-out line LP1 shown in FIG. 3. The first driving voltage line DVL1 may be connected to each first power line PL1 shown in FIG. 3 to transfer the voltage of the first driving power source to the first power line PL1. Also, the first driving voltage line DVL1 may be electrically connected to the electrostatic discharge prevention parts ESDP. In case that static electricity is introduced into the first, second, and third data lines D1, D2, and D3, a pulse potential caused by the static electricity may be distributed through the first driving voltage line DVL1.

The first driving voltage line DVL1 may be located in other areas except the electrostatic discharge prevention circuit area ESDPA, e.g., the fan-out area FTA. In a plan view, the first driving voltage line DVL1 may be provided in a plate shape corresponding to the fan-out area FTA of the non-display area NDA. However, the disclosure is not limited thereto, and the shape of the first driving voltage line DVL1 may be variously modified.

A first conductive line CL1 of a third sub-scan line S2_1, a first layer FL of a lath power line PL1*a*, an initialization power line IPL, a 2ath power line PL2*a*, and a first conductive line CL1 of a fourth sub-scan line S2_2 may be disposed in the electrostatic discharge prevention circuit area ESDPA of the non-display area NDA. The first conductive line CL1 of the third sub-scan line S2_1, the first layer FL of the lath power line PL1*a*, the initialization power line IPL, the 2ath power line PL2*a*, and the first conductive line CL1 of the fourth sub-scan line S2_2 have been described in detail with reference to FIGS. 5 to 8, and therefore, overlapping descriptions will be omitted.

Fan-out lines LP3 to LP9 may be disposed in the first, second, and third sub-areas SA1, SA2, and SA3 of the non-display area NDA. A third fan-out line LP3 may be integrally provided (or formed) with the first conductive line CL1 of the third sub-scan line S2_1 to be electrically and physically connected to the third sub-scan line S2_1. A fourth fan-out line LP4 may be integrally provided (or formed) with the initialization power line IPL to be electrically and physically connected to the initialization power line IPL. A fifth fan-out line LP5 may be integrally provided (or formed) with the first data line D1 to be electrically and physically connected to the first data line D1. A sixth fan-out line LP6 may be integrally provided (or formed) with the second data line D2 to be electrically and physically connected to the second data line D2. A seventh fan-out line LP7 may be integrally provided (or formed) with the third data line D3 to be electrically and physically connected to the third data line D3. An eighth fan-out line LP8 may be integrally provided (or formed) with the first layer FL of the 2ath power line PL2*a* to be electrically and physically connected to the 2ath power line PL2*a*. A ninth fan-out line LP9 may be integrally provided (or formed) with the first conductive line CL1 of the fourth sub-scan line S2_2 to be electrically and physically connected to the fourth sub-scan line S2_2.

Each of the fan-out lines LP3 to LP9 may correspond to the first conductive layer provided on the substrate SUB. Each of the fan-out lines LP3 to LP9 may be provided in the same layer as the first conductive line CL1 of the third sub-scan line S2_1, the first layer FL of the lath power line PL1*a*, the initialization power line IPL, the first, second, and third data lines D1, D2, and D3, the first layer FL of the 2ath power line PL2*a*, and the first conductive line CL1 of the fourth sub-scan line S2_2, include the same material as the first conductive line CL1 of the third sub-scan line S2_1, the first layer FL of the lath power line PL1*a*, the initialization power line IPL, the first, second, and third data lines D1, D2, and D3, the first layer FL of the 2ath power line PL2*a*, and the first conductive line CL1 of the fourth sub-scan line S2_2, and be formed through the same process as the first conductive line CL1 of the third sub-scan line S2_1, the first layer FL of the lath power line PL1*a*, the initialization power line IPL, the first, second, and third data lines D1, D2, and D3, the first layer FL of the 2ath power line PL2*a*, and the first conductive line CL1 of the fourth sub-scan line S2_2.

The third fan-out line LP3 may be divided into a first oblique part SULa, a linear part SULb, and a second oblique part SULc according to a shape thereof. The first oblique part SULa of the third fan-out line LP3 may be located in the first sub-area SA1, the linear part SULb of the third fan-out line LP3 may be located in the second sub-area SA2, and the second oblique part SULc of the third fan-out line LP3 may be located in the third sub-area SA3. In the above-described manner, each of the fourth, fifth, sixth, seventh, eighth, and ninth fan-out lines LP4, LP5, LP6, LP7, LP8, and LP9 may include a linear part, a first oblique part, and a second oblique part.

Although a case where the electrostatic discharge prevention parts ESDP are disposed in the electrostatic discharge prevention circuit area ESDPA has been illustrated in FIGS. 16 and 17, the disclosure is not limited thereto. For example, the electrostatic discharge prevention parts ESDP may be located in the second sub-area SA2 in which the linear part SULb is located.

In an embodiment, at least one of the bridge lines BRL1 to BRL3 may be partially removed, so that a corresponding electrostatic discharge prevention part ESDP and a corresponding data line may be electrically separated from each other.

For example, as shown in FIG. 17, the first bridge line BRL1 may be partially removed to be separated into sub-bridge lines BRL_1_S1 and BRL_1_S2, and the electrostatic discharge prevention part ESDP may be electrically separated from the first data line D1. For example, the second bridge line BRL2 may be partially removed to be separated into sub-bridge lines BRL_2_S1 and BRL_2_S2, and the electrostatic discharge prevention part ESDP may be electrically separated from the second data line D2. For example, the third bridge line BRL3 may be partially removed to be separated into sub-bridge lines BRL_3_S1 and BRL_3_S2, and the electrostatic discharge prevention part ESDP may be electrically separated from the third data line D3.

Figure 19:
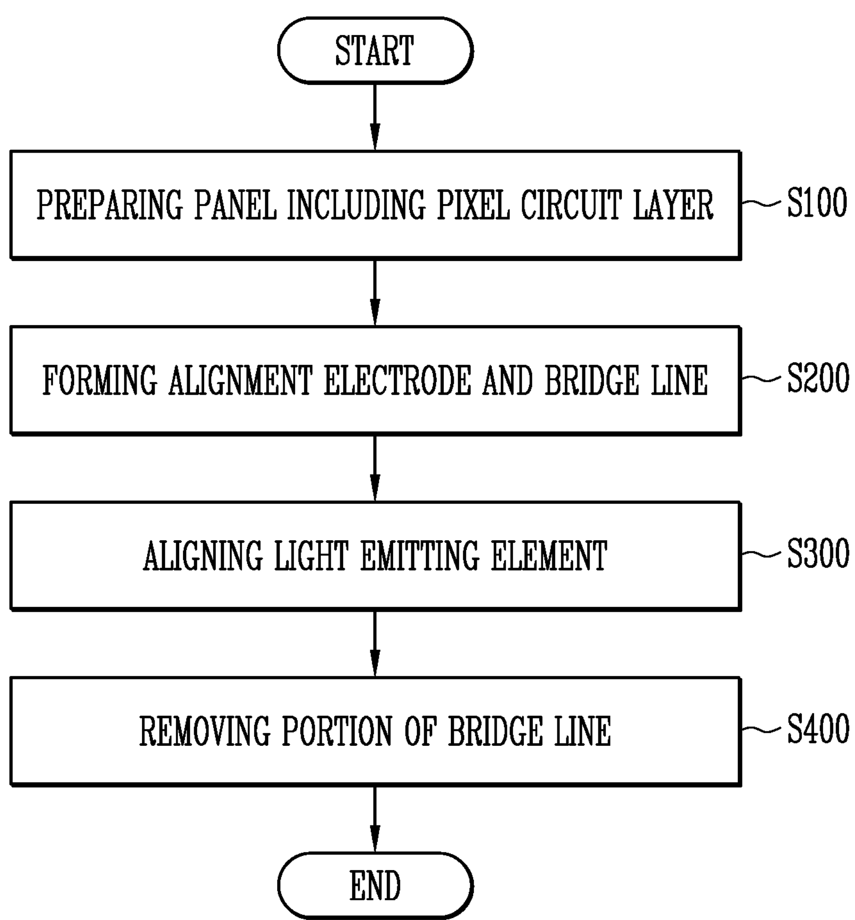
FIGS. 19 and 20 are flowcharts schematically illustrating a method of manufacturing the display device in accordance with embodiments of the disclosure.
Figure 20:
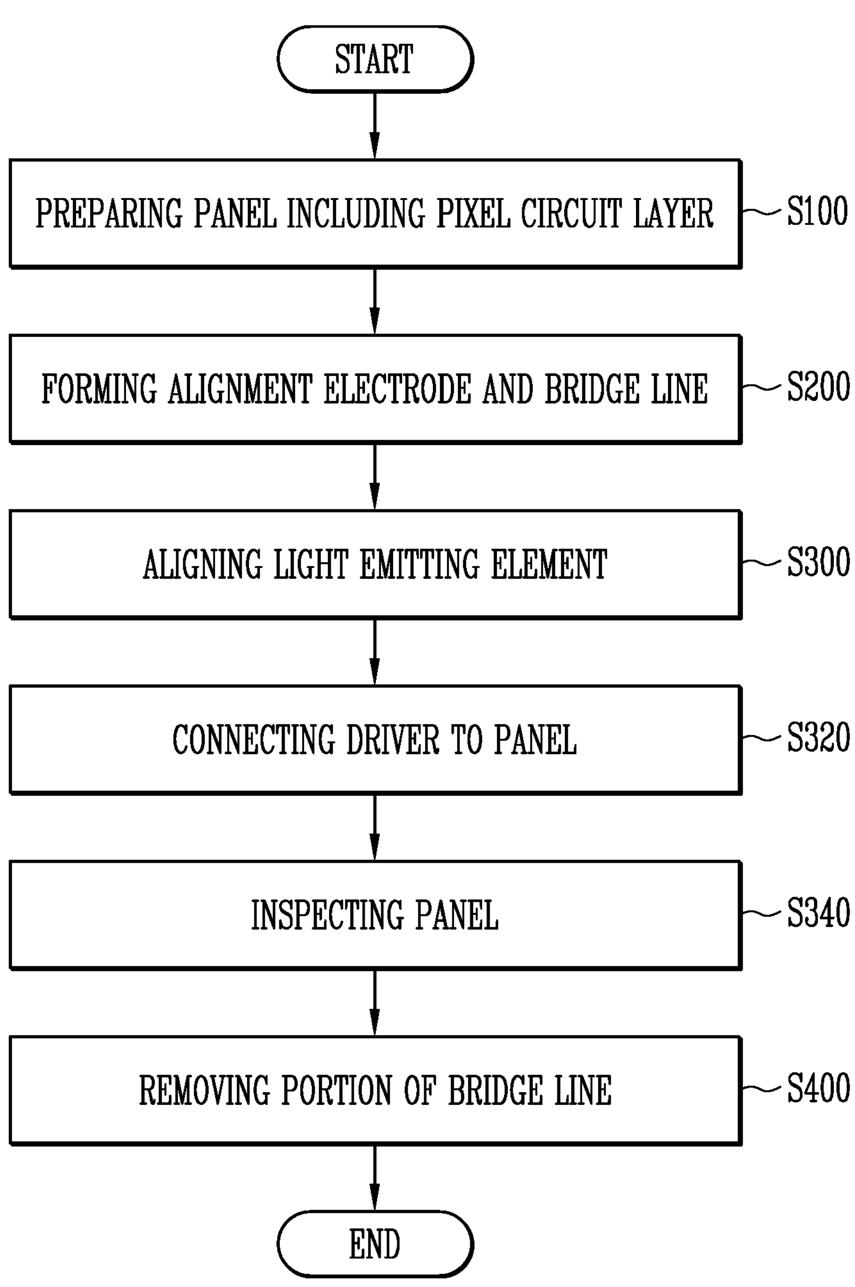

FIGS. 19 and 20 are flowcharts schematically illustrating a method of manufacturing the display device in accordance with embodiments of the disclosure.

Referring to FIGS. 3 to 20, a panel including a pixel circuit layer PCL (see FIGS. 7 and 8) may be prepared (S100). As described with reference to FIGS. 5 to 11, the pixel circuit layer PCL may include a first power line, a data line, a pixel circuit PXC (see FIG. 4) (or at least one transistor and a storage capacitor), and an electrostatic discharge prevention circuit ESDP.

Subsequently, a display element layer DPL may be formed on the panel (or the pixel circuit layer PCL).

As described with reference to FIGS. 7, 8, and 11, an alignment electrode (or electrodes EL1 to EL4) and a bridge line BRL may be formed on the pixel circuit layer PCL (S200). Subsequently, a first insulating layer INS1 covering the electrodes EL1 to EL4 and the bridge line BRL may be formed, a bank BNK may be formed on the first insulating layer INS1, light emitting elements LD may be supplied to a second opening area OP2 of the bank BNK through an inkjet process or the like, and an alignment signal may be applied to the electrodes EL1 to EL4, thereby aligning the light emitting elements LD between the electrodes EL1 to EL4 (S300).

Subsequently, a second insulating layer INS2, first and second pixel electrodes CNE1 and CNE2 (and an intermediate electrode CTE), and a third insulating layer INS3 may be sequentially formed.

After the light emitting elements LD are aligned on the first insulating layer INS1, a portion of the bridge line BRL may be removed (S400). As described with reference to FIGS. 9 to 17, the portion of the bridge line BRL is removed, so that the electrostatic discharge prevention circuit ESDP may be electrically separated from the data line DL.

In an embodiment, in a process of removing a portion of at least one of the electrodes EL1 to EL4, the portion of the bridge line BRL may be removed. For example, the portion of each of the electrodes EL1 to EL4 and the portion of the bridge line BRL may be simultaneously removed.

In another embodiment, after the display device DD shown in FIG. 3 is completely manufactured, the portion of the bridge line BRL may be removed.

For example, a driver DIC of the display device DD shown in FIG. 3 may be connected to a pad part PD (S320). Subsequently, an inspection on whether the driver DIC of the display device DD shown in FIG. 3 has been normally connected to the pad part PD (or the data line DL) may be performed, or an inspection of measuring a contact resistance between pads P of the driver DIC may be performed (S340). Subsequently, the portion of the bridge line BRL may be removed based on a result of the inspection. As described with reference to FIGS. 14 and 15, in case that a contact between the driver DIC and the data line DL is opened, burnt may occur due to the electrostatic discharge prevention circuit ESDP, and therefore, the bridge line BRL corresponding to a data line which is not normally connected to the driver DIC may be removed.

In the display device in accordance with the disclosure, an electrostatic discharge prevention circuit may be connected to a data line through a bridge line, and the bridge line may be located in the same layer as an electrode (reflective electrode, or alignment electrode) of a pixel. Thus, as a portion of the bridge line may be removed, the electrostatic discharge prevention circuit can be readily separated from the data line, and occurrence of burn can be prevented. Accordingly, the reliability of the display device can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure.

What is claimed is:

1. An electronic device comprising:
a pixel disposed in a display area of a substrate, the pixel being electrically connected to a first power line and a data line; and
an electrostatic discharge prevention circuit disposed in a non-display area of the substrate, the electrostatic discharge prevention circuit being electrically connected between the data line and the first power line, wherein
the electrostatic discharge prevention circuit is electrically connected directly to the first power line, and is connected to a bridge line that is electrically connected to the data line,
the bridge line and the first power line are disposed in different layers with at least one insulating layer interposed therebetween,
the electrostatic discharge prevention circuit includes a transistor and a first bridge pattern disposed on a gate electrode of the transistor to form a first capacitor together with the gate electrode,
the bridge line is disposed on the first bridge pattern and is in electrical contact with the first bridge pattern through a via hole,
the bridge line is in electrical contact with a second bridge pattern disposed in a same layer as the first bridge pattern through a via hole, and
the second bridge pattern is in electrical contact with the data line through a contact hole.

2. The electronic device of claim 1, wherein
the first power line and the first bridge pattern are disposed in a same layer, and
the first power line forms a second capacitor together with the gate electrode of the transistor.

3. The electronic device of claim 1, wherein
the pixel includes:
a first electrode and a second electrode that are spaced apart from each other; and
a light emitting element disposed between the first electrode and the second electrode, and
the first electrode, the second electrode, and the bridge line are disposed in a same layer.

4. The electronic device of claim 3, wherein
the bridge line, the first electrode, and the second electrode include a same material, and
the bridge line, the first electrode, and the second electrode are formed through a same process.

5. The electronic device of claim 4, wherein
the bridge line, the first electrode, and the second electrode include an opaque metal, and
the first electrode and the second electrode reflect light emitted from the light emitting element in an image display direction.

6. The electronic device of claim 3, wherein a portion of the bridge line is removed, so that the electrostatic discharge prevention circuit becomes electrically separated from the data line.

7. The electronic device of claim 6, further comprising:
a first insulating layer covering the bridge line, the first electrode, and the second electrode,
wherein a portion of the first insulating layer, which corresponds to the portion of the bridge line, is removed.

8. The electronic device of claim 1, wherein, the bridge line traverses another data line disposed between the electrostatic discharge prevention circuit and the data line.

9. A display device comprising:
data lines disposed in a first direction, the data lines extending in a second direction;
a first power line extending in the second direction;
pixels electrically connected to the first power line and the data lines; and
electrostatic discharge prevention circuits disposed between the first power line and the data lines, the electrostatic discharge prevention circuits each being electrically connected to the first power line and a corresponding bridge line that is electrically connected to a corresponding data line among the data lines, wherein one of the electrostatic discharge prevention circuits is connected to a first bridge line that is electrically connected to one of the data lines, another of the electrostatic discharge prevention circuits is connected to a second bridge line that is electrically connected to another of the data lines, the first bridge line and the first power line are disposed in different layers, at least one of the first bridge line or the second bridge line is configured to be partially removed to electrically separate the electrostatic discharge prevention circuit from the corresponding data line, each of the pixels includes:

a first electrode and a second electrode that are spaced apart from each other; and a light emitting element disposed between the first electrode and the second electrode, and the first electrode, the second electrode, and the first bridge line are disposed in a same layer.

10. The display device of claim 9, wherein the electrostatic discharge prevention circuits are disposed in the second direction between the one of the data lines and the first power line.

11. The display device of claim 10, wherein the second bridge line extends in the second direction and traverses the one of the data lines.

12. The display device of claim 10, wherein at least one of the first bridge line or the second bridge line is partially removed, so that at least one of the electrostatic discharge prevention circuits becomes electrically separated from the corresponding data line.

13. The display device of claim 9, wherein the first bridge line, the first electrode, and the second electrode include a same material, and the first bridge line, the first electrode, and the second electrode are formed through a same process.

14. A method of manufacturing a display device, the method comprising:

preparing a panel including a first power line, a data line, a pixel circuit, and an electrostatic discharge prevention circuit, each of the pixel circuit and the electrostatic discharge prevention circuit being electrically connected to the first power line and the data line and including at least one transistor;

forming a first electrode, a second electrode, and a bridge line on the panel, the bridge line being electrically connected to the electrostatic discharge prevention circuit and the data line;

aligning a light emitting element between the first electrode and the second electrode; and removing a portion of the bridge line.

15. The method of claim 14, wherein the portion of the bridge line is removed, so that the electrostatic discharge prevention circuit becomes electrically separated from the data line.

16. The method of claim 14, wherein the removing of the portion of the bridge line includes simultaneously removing a portion of at least one of the first electrode or the second electrode with the portion of the bridge line.

17. The method of claim 14, further comprising:

before the removing of the portion of the bridge line, electrically connecting a driver to the data line; and inspecting a connection state between the driver and the data line, wherein the portion of the bridge line is removed based on a result of the inspection.

* * * * *